(12) United States Patent
Kim et al.

(10) Patent No.: US 9,754,944 B2
(45) Date of Patent: Sep. 5, 2017

(54) METHOD OF MANUFACTURING SEMICONDUCTOR DEVICE

(71) Applicant: Samsung Electronics Co., Ltd., Suwon-Si, Gyeonggi-Do (KR)

(72) Inventors: Dae-ik Kim, Hwaseong-si (KR); Hyoung-sub Kim, Seongnam-si (KR); Yoo-sang Hwang, Suwon-Si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 14/539,558

(22) Filed: Nov. 12, 2014

(65) Prior Publication Data

US 2015/0132943 A1 May 14, 2015

(30) Foreign Application Priority Data

Nov. 13, 2013 (KR) .................. 10-2013-0137882

(51) Int. Cl.
*H01L 21/768* (2006.01)
*H01L 27/108* (2006.01)

(52) U.S. Cl.
CPC .. *H01L 27/10823* (2013.01); *H01L 27/10876* (2013.01); *H01L 27/10885* (2013.01); *H01L 27/10888* (2013.01); *H01L 27/10891* (2013.01); *H01L 27/10814* (2013.01)

(58) Field of Classification Search
CPC ......... H01L 27/10823; H01L 27/10885; H01L 27/10876; H01L 27/10888; H01L 27/10891; H01L 27/10814; H01L 23/52; H01L 21/7682; H01L 21/76829; H01L 23/53295; H01L 21/76841; H01L 21/76802; H01L 23/5226
See application file for complete search history.

(56) References Cited

U.S. PATENT DOCUMENTS

| 8,008,698 B2 | 8/2011 | Lee et al. |
| 8,283,714 B2 | 10/2012 | Seo et al. |
| 8,357,969 B2 | 1/2013 | Sung |

(Continued)

FOREIGN PATENT DOCUMENTS

| KR | 2002-0002682 A | 1/2002 |
| KR | 2010-0037968 A | 4/2010 |

(Continued)

*Primary Examiner* — Julio J Maldonado
*Assistant Examiner* — Stanetta Isaac
(74) *Attorney, Agent, or Firm* — Harness, Dickey & Pierce, P.L.C.

(57) ABSTRACT

Provided is a method of manufacturing a semiconductor device. The method includes forming isolated contact filling portions and an etch control portion, the isolated contact filling portions filling contact holes defined in a support layer and are spaced apart from each other in a first direction and a second direction perpendicular to the first direction and the etch control layer surrounding the isolated contact filling portions, forming an interconnection layer on the isolated contact filling portions and the etch control portion, and forming interconnection patterns by photo-etching the interconnection layer, the isolated contact patterns, and the etch control portion, the interconnection patterns being relatively narrow in the first direction and relatively wide in the second direction.

7 Claims, 54 Drawing Sheets

(56) References Cited

U.S. PATENT DOCUMENTS

| | | |
|---|---|---|
| 2011/0186923 A1* | 8/2011 | Seo et al. .................... 257/330 |
| 2012/0025300 A1 | 2/2012 | Chung et al. |
| 2012/0094454 A1 | 4/2012 | Cho et al. |
| 2013/0009226 A1* | 1/2013 | Park .................. H01L 27/10855 |
| | | 257/296 |

FOREIGN PATENT DOCUMENTS

| | | |
|---|---|---|
| KR | 2011-0001722 A | 1/2011 |
| KR | 2012-0069258 A | 6/2012 |

\* cited by examiner

METHOD OF MANUFACTURING SEMICONDUCTOR DEVICE

CROSS-REFERENCE TO RELATED APPLICATIONS

This application claims priority under 35 U.S.C. §119 to Korean Patent Application No. 10-2013-0137882, filed on Nov. 13, 2013, in the Korean Intellectual Property Office, the disclosure of which is incorporated herein in its entirety by reference.

BACKGROUND

Example embodiments relate to methods of manufacturing a semiconductor device, and more particularly, to methods of manufacturing a semiconductor device that includes a plurality of contacts (or contact patterns) and a plurality of interconnection lines (or interconnection patterns) located thereon.

As the integration of a semiconductor device increases, a design rule for the components of the semiconductor device decreases. Thus, a process of forming a plurality of contacts (or contact patterns) and a plurality of interconnection lines (or interconnection patterns) on the contacts in a highly-scaled semiconductor device is becoming increasingly complex and difficult. For example, a photo process margin between contacts and/or a photo process margin between interconnection lines in a highly-scaled semiconductor device are being reduced.

SUMMARY

Example embodiments provide a semiconductor device manufacturing method that may increase a photo process margin between contacts and/or a photo process margin between interconnection lines in a highly-miniaturized semiconductor device manufacturing process.

According to an example embodiment, a method of manufacturing a semiconductor device may include forming isolated contact filling portions and an etch control portion, the isolated contact filling portions filling contact holes defined in a support layer and spaced apart from each other in a first direction and a second direction perpendicular to the first direction, the etch control portion surrounding the isolated contact filling portions, forming an interconnection layer on the isolated contact filling portions and the etch control portion, and forming interconnection patterns by photo-etching the interconnection layer, the isolated contact patterns, and the etch control portion, the interconnection patterns being relatively short in the first direction and relatively side in the second direction.

Each of the isolated contact filling portions may be formed to have different first-directional distances between one side of each of the interconnection patterns to a boundary of a corresponding one of the contact holes in the second direction. One of the first-directional distance of the isolated contact filling portions along a virtual center line of the corresponding one of the contact holes may be greater than other one of the first-directional distances of the isolated contact filling portions along a virtual line in parallel with and spaced apart from the virtual center line.

The forming the isolated contact filling portions and the etch control layer may include forming the contact holes in the support layer, the contact holes being spaced apart from each other in the first direction and the second direction, depositing a contact interconnection layer on the support layer to fill the contact holes to form the isolated contact filling portions and the etch control portion.

The method may further include forming, before the forming of the isolated contact filling portions, a plurality of buried interconnection patterns on the support layer, the buried interconnection patterns extending in the first direction and being spaced apart from each other in the second direction such that the isolated contact filling portions to be subsequently formed are arranged between the buried interconnection patterns.

The forming interconnection patterns may include forming a mask pattern on the interconnection layer, the mask pattern being relatively narrow in the first direction and relatively wide in the second direction, and forming the interconnection pattern by etching the interconnection layer, the isolated contact filling portions, and the etch control portion by using the mask pattern as an etch mask while controlling an etch rate of the isolated contact filling portions by the etch control portion.

The interconnection pattern on the isolated contact filling portions may be formed such that first-directional distances between first-directional center points along the second direction and one side of the interconnection pattern are equal in the second direction. The interconnection pattern may include a first interconnection portion formed by etching the isolated contact filling portions and a second interconnection portion that is formed by etching the interconnection layer. The isolated contact filling portions and the etch control portion may be formed of a same material.

According to an example embodiment, a method of manufacturing a semiconductor device may include forming a plurality of word lines on a substrate, the word line extending in a first direction and spaced apart from each other in a second direction perpendicular to the first direction, forming an interlayer insulating layer on the word lines and the substrate; forming direct contact holes between the word lines by etching the interlayer insulating layer and the substrate, the direct contact holes spaced apart from each other in the first direction and the second direction, forming isolated contact filling portions filling the direct contact holes and an etch control portions that surrounding the isolated contact patterns by depositing a contact interconnection layer, forming an interconnection layer on the isolated contact filling portions and the etch control portion, and forming a bit line and a direct contact pattern on the direct contact holes and the interlayer insulating layer by photo-etching the interconnection layer, the isolated contact filling portions, and the etch control portion, the bit line and the direct contact pattern being relatively narrow in the first direction and relatively wide in the second direction.

Each of the isolated contact filling portions may be formed to have different first-directional distances between one side of at least one of the bit line and points at a boundary of a corresponding one of the direct contact holes in the second direction.

One of the first-directional distance of the isolated contact filling portions along a virtual center line of the corresponding one of the contact holes may be greater than other one of the first-directional distances of the isolated contact filling portions along a virtual non-center line in parallel with and spaced apart from the virtual center line.

The direct contact holes may be formed in parallel to the bit line in the second direction. The direct contact holes may be formed to incline with respect to one side of the bit line in the first direction.

A buried contact may be formed at one side of the bit line and the direct contact in the first direction.

According to an example embodiment, a method of manufacturing a semiconductor device may include forming a lower interconnection layer including isolated contact filling portions and an etch control portion, the isolated contact filling portions filling contact holes formed in a support layer and spaced apart from each other in a first direction and a second direction perpendicular to the first direction, the etch control portion covering the isolated contact filling portions, forming an upper interconnection layer on the lower interconnection layer, and forming interconnection patterns extending in the second direction by patterning the upper and lower interconnection layers, while controlling an etch rate of the isolated contact filling portions by the etch control portion.

First-directional distances between one side of each of the interconnection patterns to a boundary of a corresponding one of the contact holes may be different in the second direction.

One of the first-directional distance of the isolated contact filling portions along a virtual center line of the corresponding one of the contact holes may be greater than the other one of the first-directional distances of the isolated contact filling portions along a virtual line in parallel with and spaced apart from the virtual center line.

The etch control portion may cover at least one of top surfaces and side surfaces of the isolated contact filling portions and the isolated contact filling portions and the etch control portion may be formed of a same material.

BRIEF DESCRIPTION OF THE DRAWINGS

Example embodiments will be more clearly understood from the following detailed description taken in conjunction with the accompanying drawings in which.

DETAILED DESCRIPTION

Figure 1A:
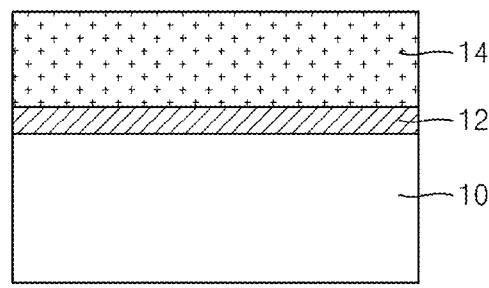
FIGS. 1A to 4F are diagrams illustrating a method of manufacturing a semiconductor device according to an example embodiment.
Figure 1B:
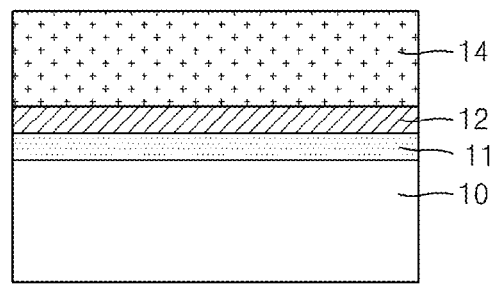
Figure 1C:
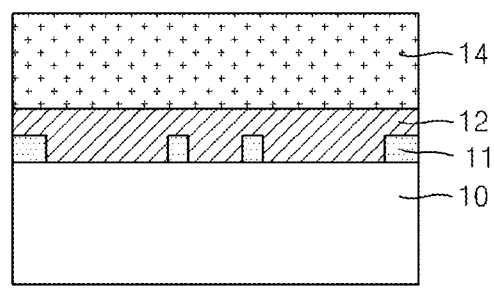
Figure 1D:
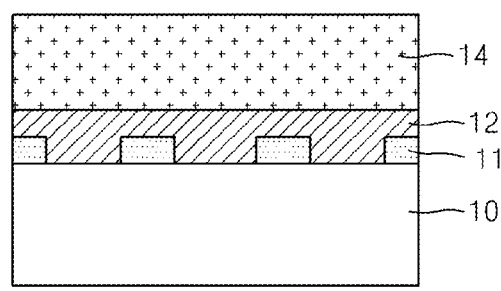

As used herein, the term "and/or" includes any and all combinations of one or more of the associated listed items. Expressions such as "at least one of," when preceding a list of elements, modify the entire list of elements and do not modify the individual elements of the list.

Hereinafter, example embodiments will be described in detail with reference to the accompanying drawings.

Various example embodiments will now be described more fully with reference to the accompanying drawings, in which some example embodiments are shown. The present disclosure may, however, be embodied in many different forms and should not be construed as being limited to the example embodiments set forth herein; rather, these example embodiments are provided so that this disclosure will be thorough and complete, and will fully convey example embodiments to those of ordinary skill in the art.

It will be understood that when an element is referred to as being "connected to" another element, it may be directly connected to the other element or intervening elements may be present. Likewise, it will be understood that when an element is referred to as being "on" another element, it may be directly on the other element or intervening elements may be present. Also, in the drawings, the structures or sizes of elements are exaggerated for clarity and convenience of description, and portions irrelevant to the description are omitted. Like reference numerals denote like elements throughout the specification and drawings.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments. It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Unless otherwise defined, all terms (including technical and scientific terms) used herein have the same meaning as commonly understood by those of ordinary skill in the art to which example embodiments pertain. It will also be understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2A:
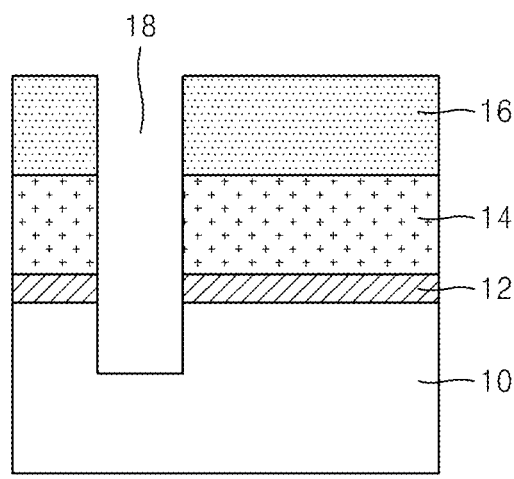
Figure 2B:
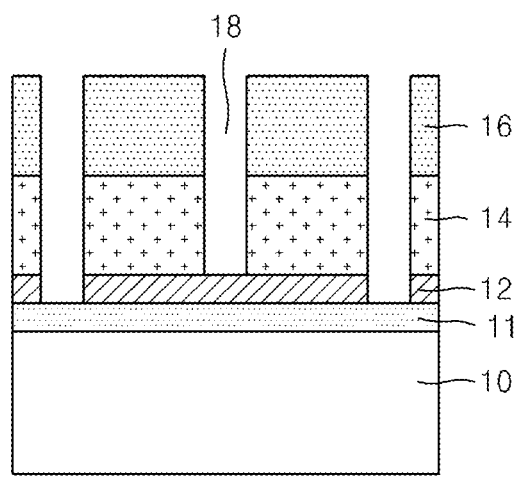
Figure 2C:
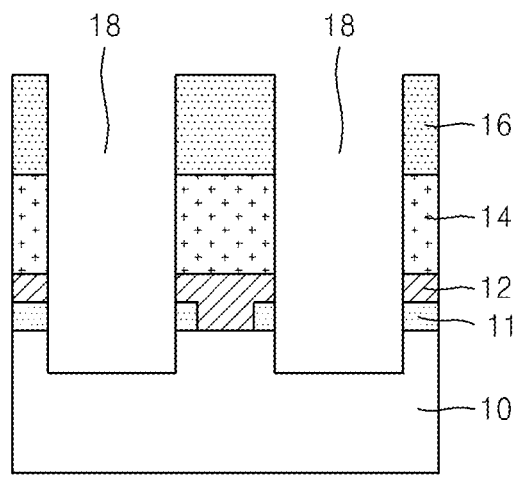
Figure 2D:
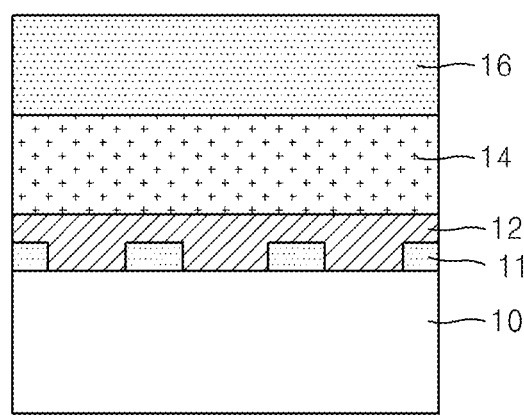
Figure 2E:
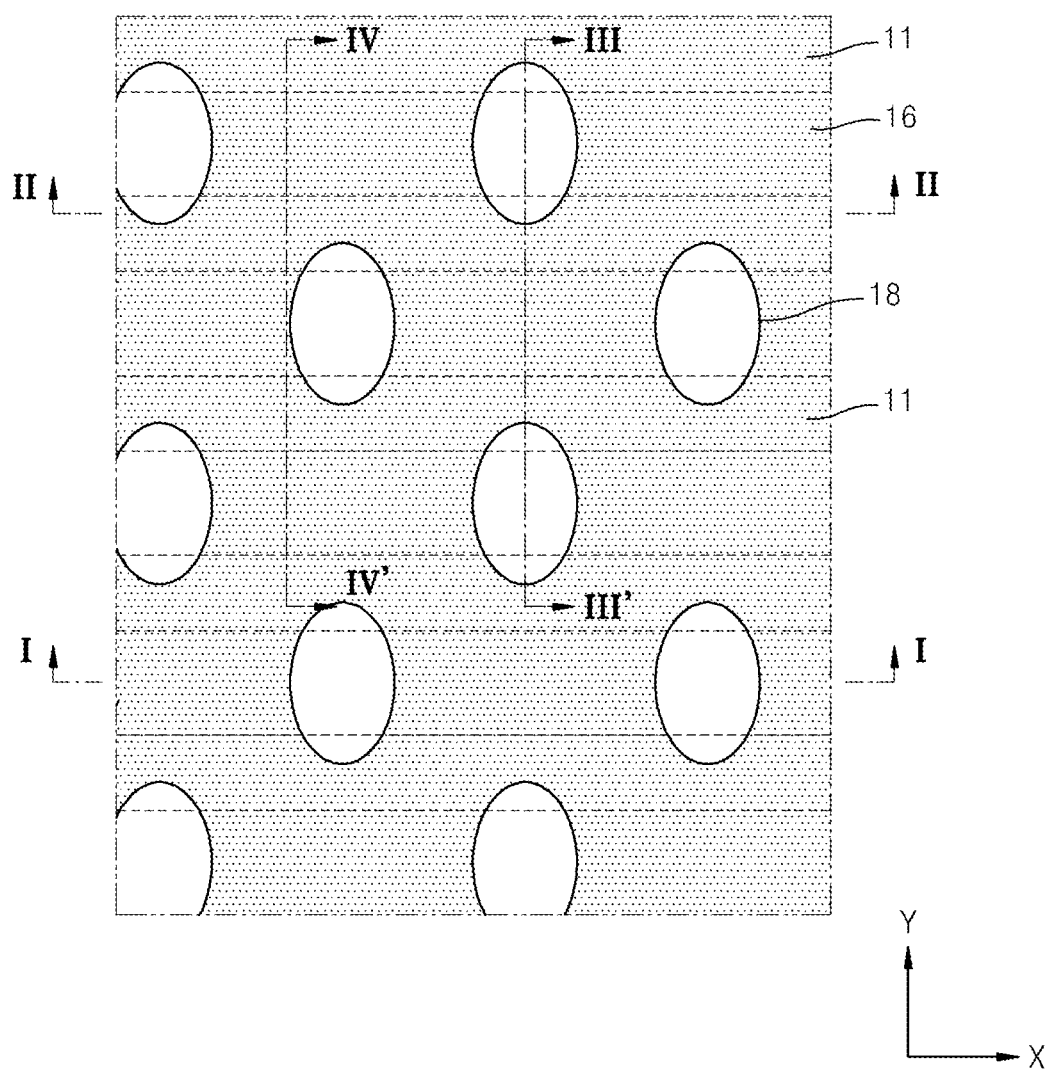
Figure 3A:
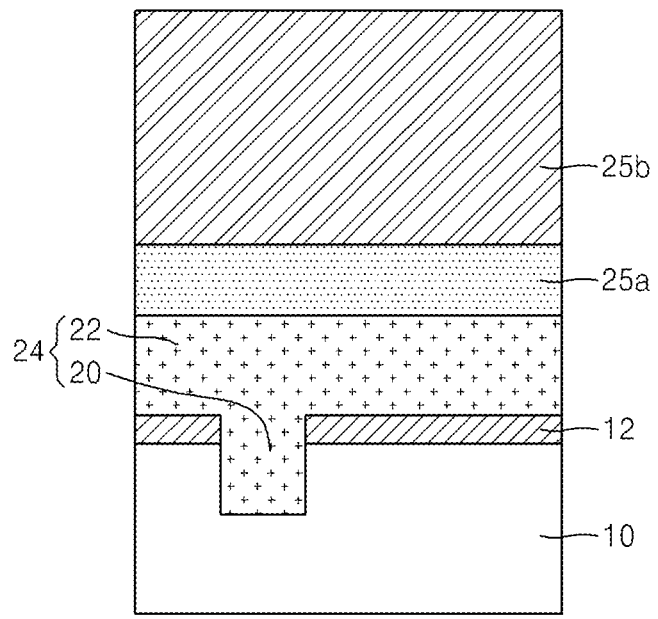
Figure 3B:
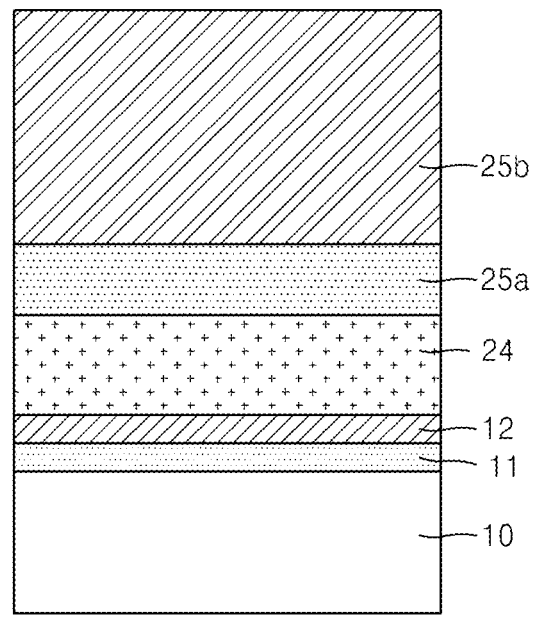
Figure 3C:
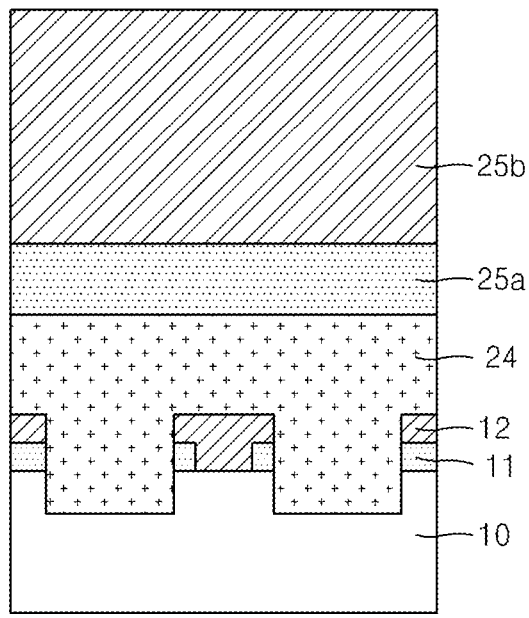
Figure 3D:
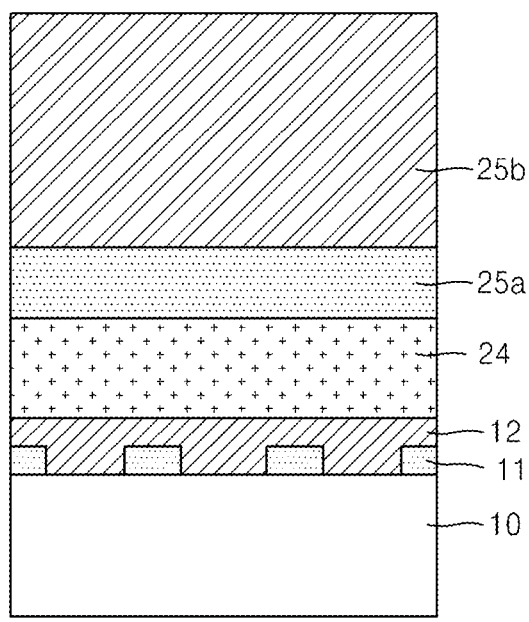
Figure 3E:
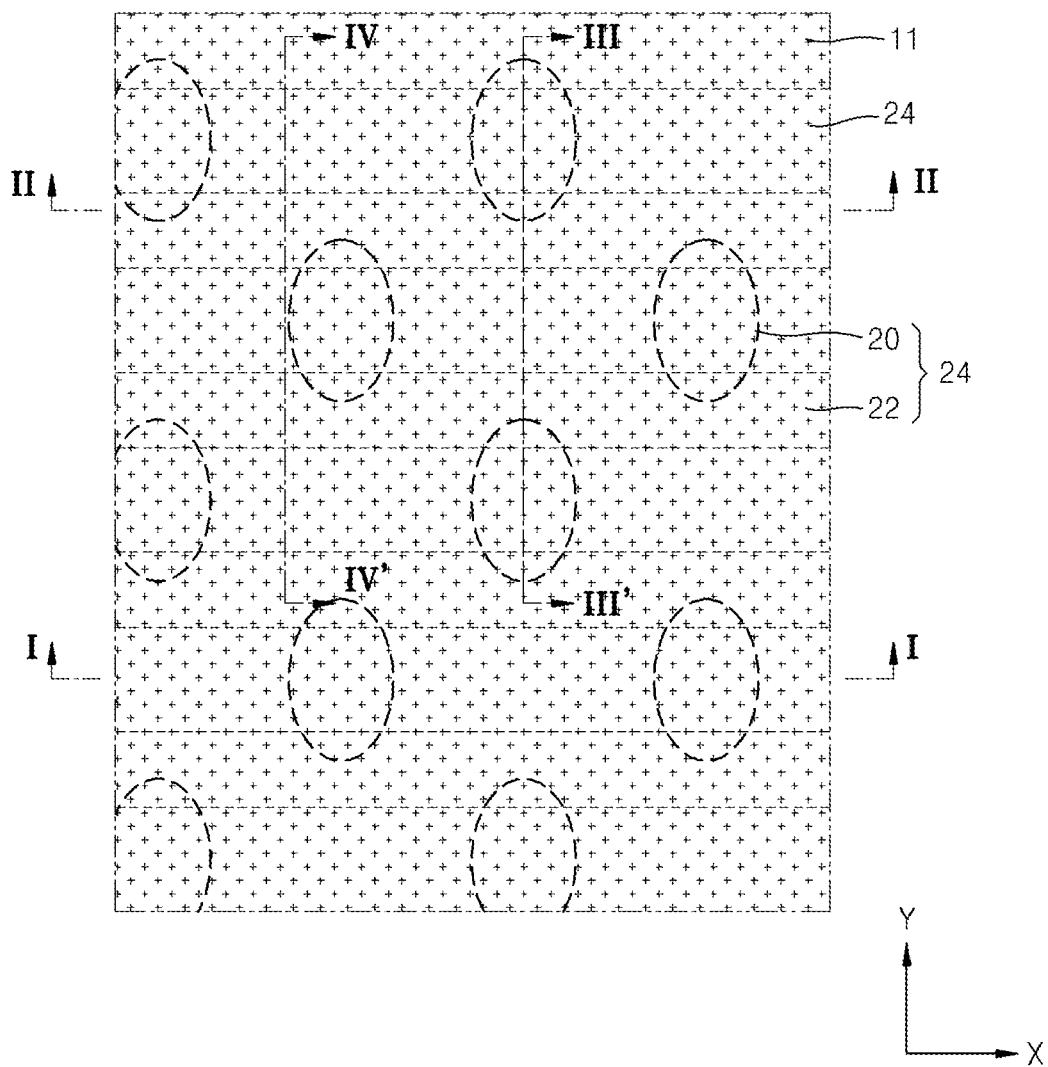
Figure 4A:
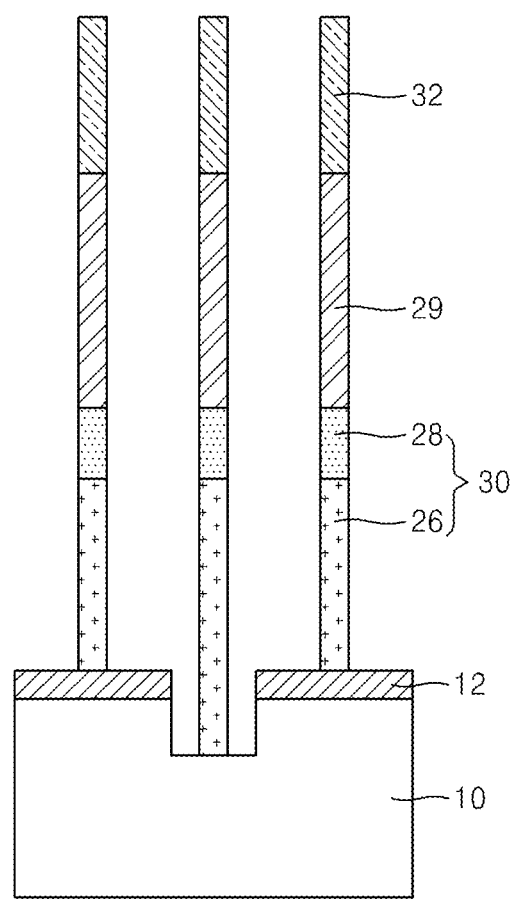
Figure 4B:
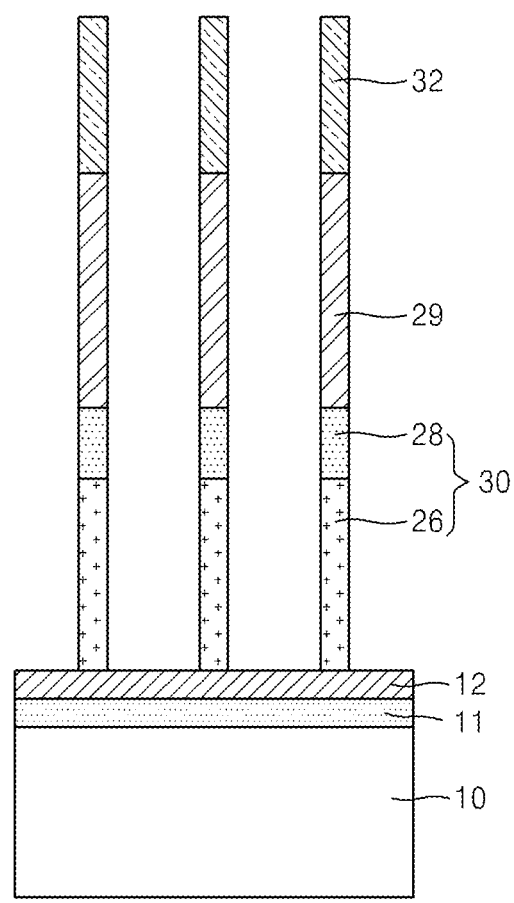
Figure 4C:
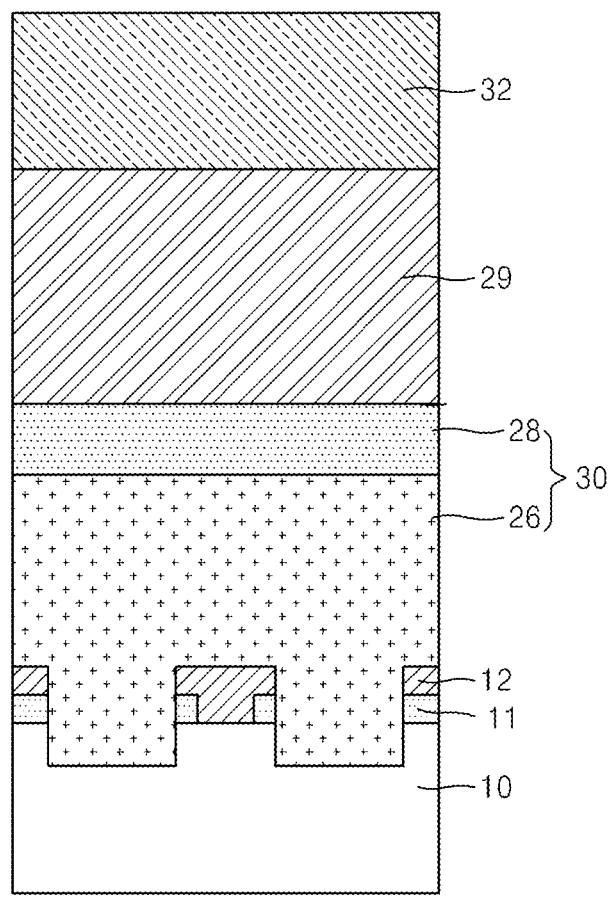
Figure 4D:
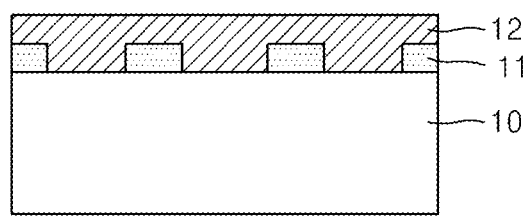
Figure 4E:
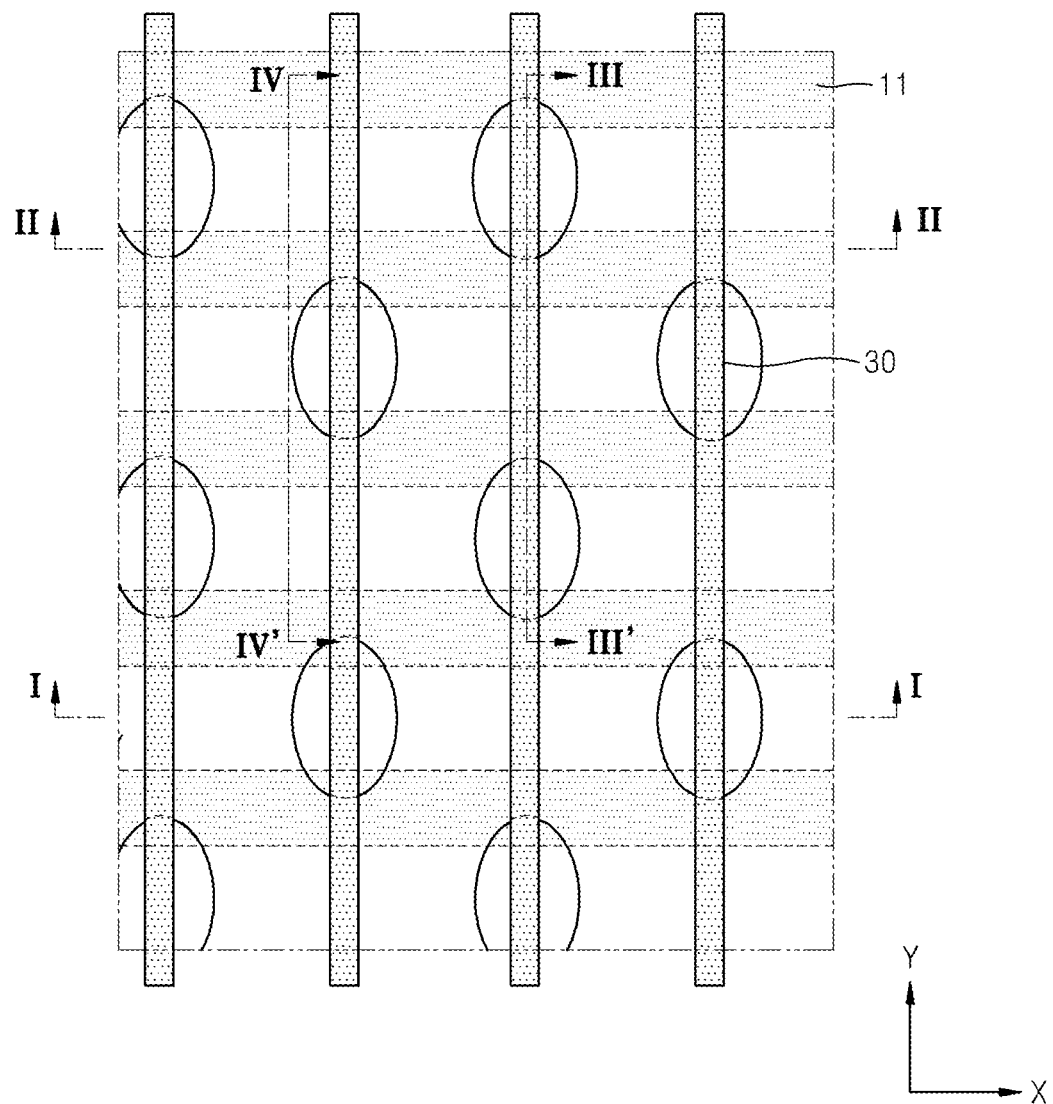
Figure 4F:
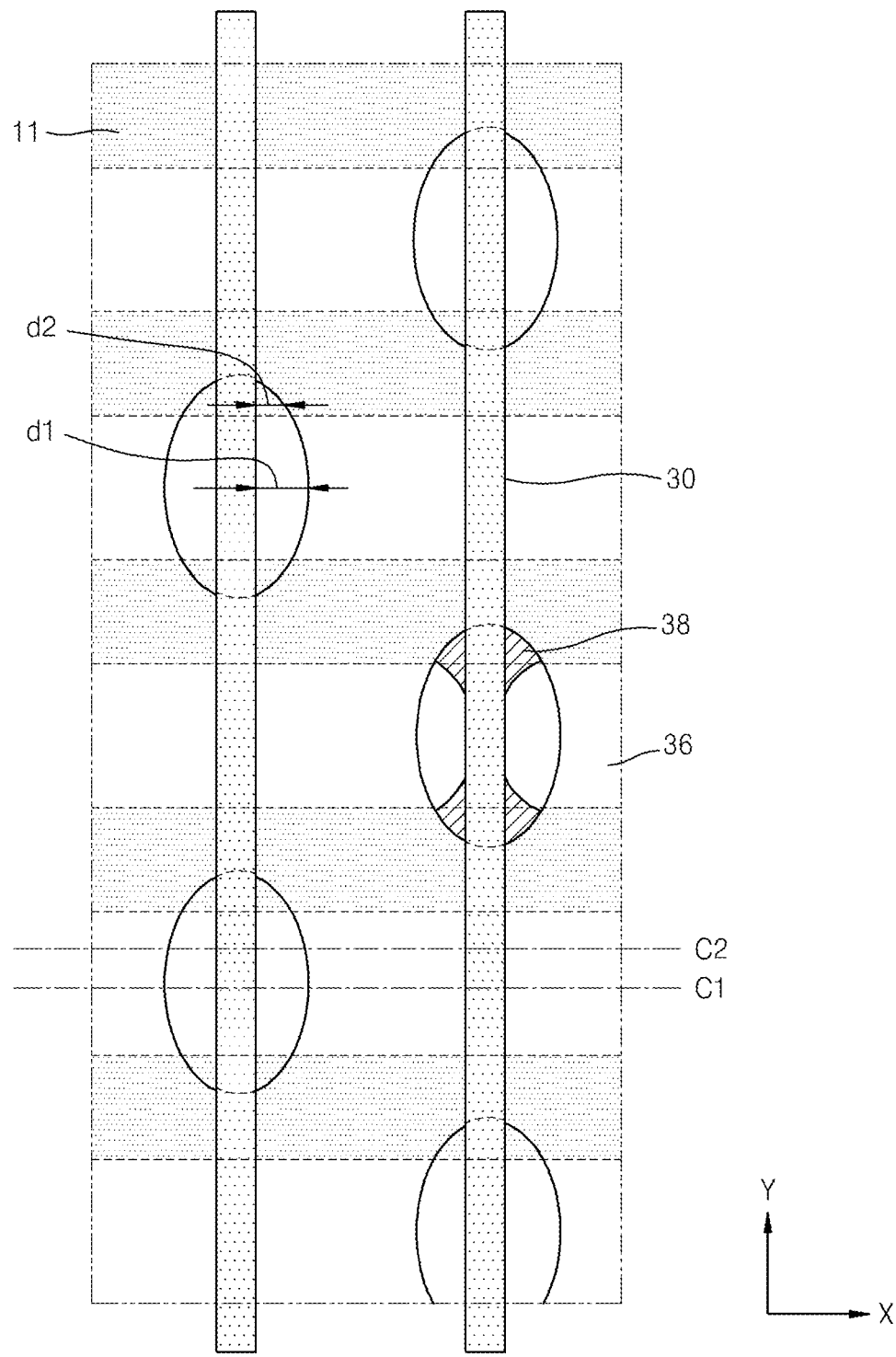

FIGS. 1A to 4F are diagrams for illustrating a method of manufacturing a semiconductor device according to an example embodiment. FIGS. 1A, 2A, 3A, and 4A are respectively cross-sectional views taken along line I-I' of FIGS. 1E, 2E, 3E, and 4E; FIGS. 1B, 2B, 3B, and 4B are respectively cross-sectional views taken along line II-II' of FIGS. 1E, 2E, 3E, and 4E; FIGS. 1C, 2C, 3C, and 4C are respectively cross-sectional views taken along line III-III' of FIGS. 1E, 2E, 3E, and 4E; and FIGS. 1D, 2D, 3D, and 4D are respectively cross-sectional views taken along line IV-IV' of FIGS. 1E, 2E, 3E, and 4E. FIG. 4F is a plan view for illustrating a manufacturing process of FIGS. 4A to 4E.

Referring to FIGS. 1A to 1E, buried interconnection patterns 11 may be formed on a support layer 10. The support layer 10 may be, for example, a silicon substrate. When the support layer 10 is a substrate, an insulating layer, for example, an oxide layer may be further formed on the support layer 10. The support layer 10 may be an insulating layer.

Figure 1E:
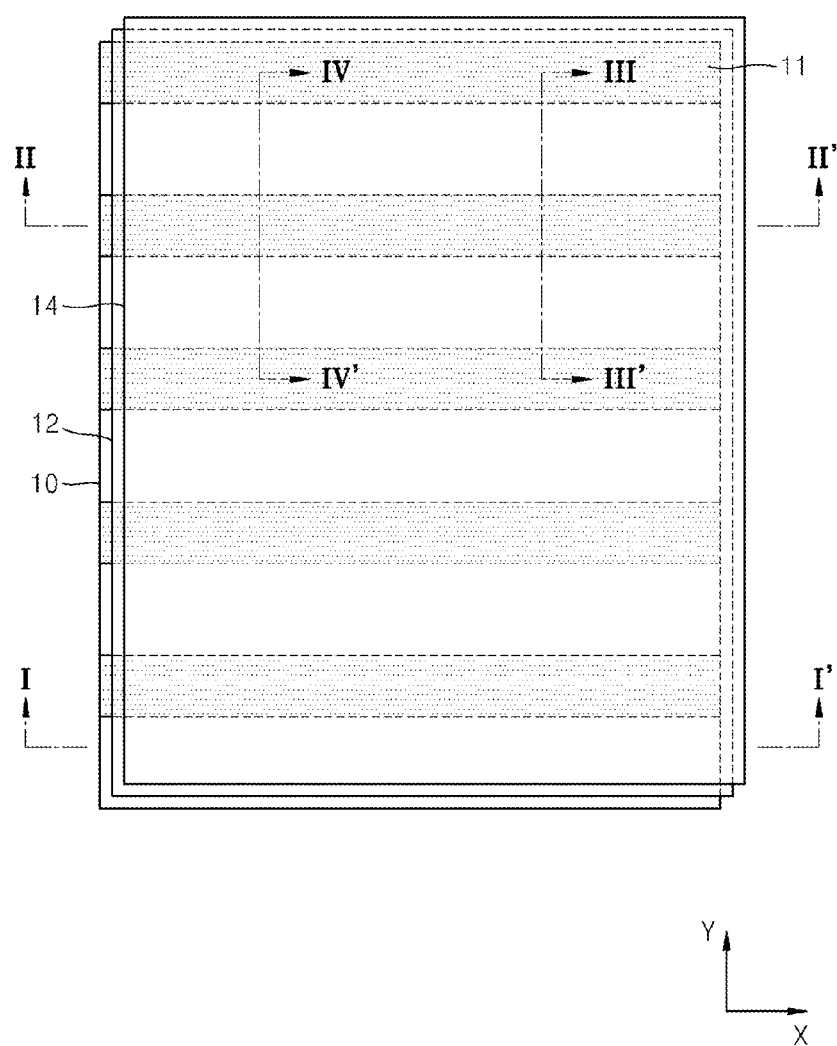

As illustrated in FIG. 1E, the buried interconnection patterns 11 may extend in a first direction (X-axis direction) and may be spaced apart from each other in a second direction (Y-axis direction) that is perpendicular to the first direction. The buried interconnection patterns 11 may be word line patterns in the semiconductor device. In some cases, the buried interconnection patterns 11 may not be formed.

An interlayer insulating layer 12 may be formed on the support layer 10 and the buried interconnection patterns 11. The interlayer insulating layer 12 may be formed on the support layer 10, on the buried interconnection patterns 11, and between the buried interconnection patterns 11. The interlayer insulating layer 12 may be formed of, for example, an oxide layer. The interlayer insulating layer 12 may be formed to insulate the buried interconnection patterns 11 and upper interconnection patterns that will be formed later.

A first lower interconnection layer 14 may be formed on the interlayer insulating layer 12. The first lower interconnection layer 14 may be formed on the support layer 10. The first lower interconnection layer 14 may be formed of a conductive layer, for example, a metal layer. The first lower interconnection layer 14 may be formed of a doped polysilicon layer.

Referring to FIGS. 2A to 2E, a mask pattern 16 may be formed on the first lower interconnection layer 14. The mask pattern 16 may be a photoresist pattern that is formed by a photo process. For example, the mask pattern 16 may be formed by forming a photoresist layer on the lower contact interconnection layer 14 and exposing and developing the photoresist layer.

By using the mask pattern 16 as an etch mask, the first lower interconnection layer 14, the interlayer insulating layer 12, and the support layer 10 may be sequentially etched to form a plurality of contact holes 18. The contact holes 18 may be formed to expose one surface of the interlayer insulating layer 12 and/or the support layer 10.

As illustrated in FIG. 2E, the contact holes 18 may be spaced apart from each other in the first direction (X-axis direction) and the second direction (Y-axis direction). Also, as illustrated in FIG. 2E, the contact holes 18 may be spaced apart from each other in the first direction (X-axis direction) and the second direction (Y-axis direction) while being formed between the buried interconnection patterns 11. Although FIGS. 2A and 2C illustrate that the contact holes 18 are formed in the support layer 10 by etching an upper portion of the support layer 10, the contact holes 18 may be formed on the support layer 10 by stopping the etching at a surface of the support layer 10.

Referring to FIGS. 3A to 3E, the mask pattern 16 may be removed. Thereafter, a second lower interconnection layer may be formed on the first lower interconnection layer 14 to fill the contact holes 18. The second lower interconnection layer may be formed on the support layer 10. The second lower interconnection layer may be formed of a conductive layer, for example, a metal layer. The second contact interconnection layer may be formed of a doped polysilicon layer. After the forming of the second lower interconnection layer, the second lower interconnection layer may be etched back.

In FIGS. 3A to 3E, a resultant structure of the first lower interconnection layer 14 and second lower interconnection layer are collectively illustrated and referred to as a lower interconnection layer 24". The lower interconnection layer 24 may be formed on the interlayer insulating layer 12 to fill the contact holes 18.

As illustrated in FIGS. 3A, 3C, and 3E, the lower interconnection layer 24 may include isolated contact filling portions 20 and an etch control portion 22. The isolated contact filling portions 20 may refer to a portion of the lower interconnection layer 24 that fills the contact holes 18. The isolated contact filling portions 20 may be located on the support layer 10, and be spaced apart and isolated from each other in the first direction and the second direction. The etch control portion 22 may cover the isolated contact filling portions 20. The isolated contact filling portions 20 and the etch control layer 22 may be formed of the same material.

The etch control portion 22 may refer to a portion of the lower interconnection layer 24 that does not fill the contact holes 18. As will be described later, when forming the isolated contact filling portions 20 by patterning the lower interconnection layer 24, the etch control portion 22 may serve to control an etch rate of the isolated contact filling portions 20 such that a profile of one sidewall of an interconnection pattern to be formed is vertical in a cross-sectional view and linear in a plan view.

Subsequently, an upper interconnection layer 25a and a capping layer 25b may be formed on the lower interconnection layer 24. In some cases, the capping layer 25b may not be formed. The upper interconnection layer 25a and the capping layer 25b may be formed on the isolated contact filling portions 20 and the etch control portion 22. The upper interconnection layer 25a may be formed of a conductive layer. For example, the interconnection layer 25a may be formed of a tungsten layer. The capping layer 25b may be formed of an insulating layer. For example, the capping layer 25b may be formed of a nitride layer. In FIG. 3E, the upper interconnection layer 25a and the capping layer 25b are not illustrated for convenience' sake.

Referring to FIGS. 4A to 4E, the capping layer 25B, the upper interconnection layer 25a, and the lower interconnection layer 24 may be photo-etched to form interconnection patterns 30 and capping patterns 29 on the support layer 10. For example, the capping layer 25b, the upper interconnection layer 25a, the isolated contact filling portions 20, and the etch control portion 22 may be photo-etched to form the interconnection patterns 30 on the support layer 10.

The interconnection patterns 30 and the capping patterns 29 may be formed by the following process.

For example, a mask pattern 32 may be formed on the capping layer 25b to be relatively narrow in the first direction and to be relatively wide in the second direction. The mask pattern 32 may be a photoresist pattern that is formed by a photo process. For example, the mask pattern 32 may be formed by forming a photoresist layer (not illustrated) on the capping layer 25b and exposing and developing the photoresist layer. The capping patterns 29 and the interconnection patterns 30 may be formed by etching the capping layer 25b, the interconnection layer 25a, the isolated contact filling portions 20, and the etch control portion 22 by using the mask pattern 32 as an etch mask while controlling an etch rate of the isolated contact filling portions 20 by the etch control portion 22.

As illustrated in FIG. 4E, the interconnection patterns 30 may be formed to be relatively narrow in the first direction and to be relatively wide in the second direction. In FIG. 4E, the capping pattern 29 is not illustrated for convenience' sake. Each of the interconnection patterns 30 may be divided into a lower interconnection portion 26 formed by etching the lower interconnection layer 24 and an upper interconnection layer 28 formed by etching the upper interconnection layer 25a.

Due to the etch control portion 22 in the lower interconnection layer 24, a profile of one sidewall of the interconnection pattern 30 may be vertical in a cross-sectional view and linear in the second direction in a plan view. This will be described with reference to FIG. 4F.

In FIGS. 4E and 4F, the capping pattern 29 is not illustrated for convenience' sake. Referring to FIG. 4F, the isolated contact filling portions 20 included in the interconnection patterns 30 may be formed to have different internal distances along the second direction (e.g., Y-axis direction) to a side wall of the contact holes 18. For example, an internal distance d1 between one side of the isolated contact filling portions 20 to a sidewall of the contact hole 18 along a virtual center line C1 in the first direction (e.g., X-axis direction) may be greater than an internal distance d2 between the same side of the isolated contact filling portions 20 and the side wall of the contact hole 18 along a horizontal line C2 other than the virtual center line C1.

Accordingly, when the isolated contact filling portions 20 are etched to form a lower portion of each of the interconnection patterns 30, the etch control portion 22 may serve to control an etch rate of the isolated contact filling portions 20. When no etch control portion 22 is used in the etching of the isolated contact filling portions 20, protrusion patterns 38 may be formed at sides of the interconnection patterns 30 as represented by a reference numeral "38" in FIG. 4F. When the protrusion pattern 38 is formed at a side of the interconnection pattern 30, the protrusion pattern 38 may short-circuits the interconnection pattern 30 with an adjacent conductive pattern 36 that may be formed at one side of a corresponding isolated contact filling portion 20.

As described above, according to some example embodiments, the etch control portion 22 may be used to control an etch rate of the isolated contact filling portions 20. When the isolated contact filling portions 20 fill the contact holes 18, the etch control portion 22 may be additionally formed. Accordingly, the profile of sidewalls of the interconnection patterns 30 may be vertical in a cross-sectional view and linear in the second direction in a plan view. Accordingly, a photo process margin between contacts (or the isolated contact filling patterns) and a photo process margin between interconnection lines (or the interconnection patterns) in a highly-scaled semiconductor device may be increased. Also, a short-circuit problem between the interconnection patterns 30 and the adjacent conductive patterns 36 may be reduced or solved.

Hereinafter, an example embodiment of applying the manufacturing method of FIGS. 1 to 4 to an actual semiconductor device will be described. However, Example embodiments are not limited to the following example embodiment.

Figure 5:
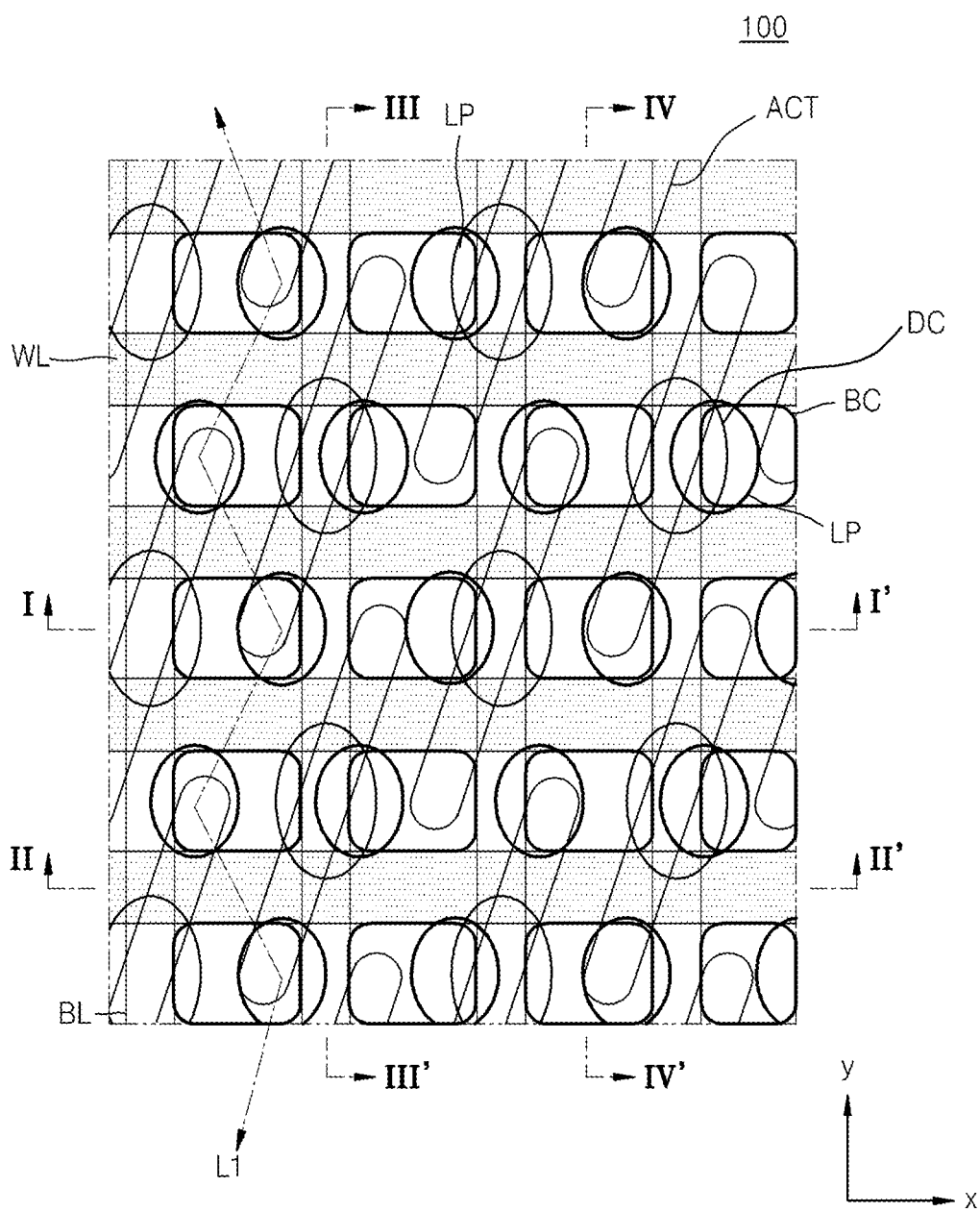
FIG. 5 is a schematic layout diagram of a semiconductor device for illustrating a method of manufacturing a semiconductor device according to an example embodiment.

FIG. 5 is a schematic layout diagram of a semiconductor device for illustrating a method of manufacturing a semiconductor device according to an example embodiment.

Referring to FIG. 5, a semiconductor device 100 according to an example embodiment may include a plurality of active regions ACT. The active regions ACT may be defined by an isolation layer 114 (see FIG. 6A) formed on a substrate 110 (see FIG. 6A). As the design rule of a semiconductor device decreases, the active region ACT may be disposed in a bar shape of a diagonal line or oblique line as illustrated in FIG. 5.

A plurality of word lines WL or gate lines, which extend in parallel to each other in the first direction (X-axis direction) across the active regions ACT and are spaced apart from each other in the second direction, may be disposed on the active regions ACT. The word lines WL may be disposed equidistantly. The width of the word line WL and/or the distance between the word lines WL may be determined according to a design rule. A plurality of bit lines BL, which extend in parallel to each other in the second direction (Y-axis direction) perpendicular to the word lines WL, may be disposed on the word lines WL. The bit lines BL may be disposed equidistantly. The width of the bit line BL and/or the distance between the bit lines BL may be determined according to a design rule.

The bit lines BL may be disposed in parallel to each other with a pitch of about 3 F therebetween. Also, the word lines WL may be disposed in parallel to each other with a pitch of about 2 F therebetween. Herein, F may refer to a minimum lithographic feature size. When the bit lines BL and the word lines WL are disposed with such a pitch therebetween, the memory device may include memory cells having a unit cell size of about 6 $F^2$.

The semiconductor device 100 may include various contact arrays formed on the active regions ACT, for example, a direct contact DC, a buried contact BC, and a landing pad LP. The direct contact DC may refer to a contact that connects the active region ACT to the bit line BL, and the buried contact BC may refer to a contact that connects the active region ACT to a bottom electrode of a capacitor (not illustrated).

The buried contact BC and the active region ACT may have a very small contact area therebetween. Accordingly, the landing pad LP, which is conductive, may be introduced to increase at least one of a contact area of the active region ACT and a contact area of the bottom electrode of the capacitor. For example, the landing pad LP may be disposed at least between the active region ACT and the buried contact BC and between the buried contact BC and bottom electrode of the capacitor. By increasing the contact area by introducing the landing pad LP, a contact resistance between the active region ACT and the bottom electrode of the capacitor may be reduced.

In the semiconductor device 100, the direct contact DC may be disposed at a center portion of the active region ACT, and the buried contact BC may be disposed at both end portions of the active region ACT. Because the buried contact BC is disposed at both end portions of the active region ACT, the landing pad LP may be disposed to partially overlap with the buried contact BC while being adjacent to both ends of the active region ACT.

The word line WL may be formed in a buried structure in the substrate 110 of the semiconductor device 100, and may be disposed across the active region ACT between the direct contacts DC and/or the buried contacts BC. As illustrated in FIG. 5, if two word lines WL are disposed across one active region ACT and the active region ACT is disposed in the shape of a diagonal line or oblique line, the active region ACT may have a desired (or alternatively, predetermined) angle of less than about 90° with respect to the word line WL.

The direct contact DC and the buried contact BC may be disposed symmetrically, and thus may be disposed on a straight line along the X axis and the Y axis. Unlike the direct contact DC and the buried contact BC, the landing pad LP may be disposed in a zigzag configuration L1 in the second direction (Y-axis direction) in which the bit line BL extends. Also, the landing pad LP may be disposed to overlap with the same side portion of each bit line BL in the first direction (X-axis direction) in which the word line WL extends. For example, each of the landing pads LP on the first line may overlap with a left side surface of the corresponding bit line BL, and each of the landing pads LP on the second line may overlap with a right side surface of the corresponding bit line BL.

FIGS. 6A to 13D are cross-sectional views for illustrating a method of manufacturing the semiconductor device illustrated in FIG. 5.

Figure 6A:
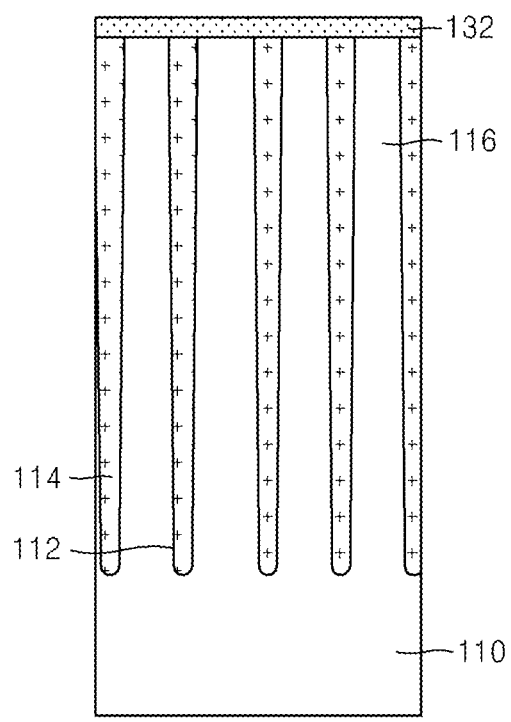
FIGS. 6A to 13D are cross-sectional views for illustrating a method of manufacturing the semiconductor device illustrated in FIG. 5.
Figure 6B:
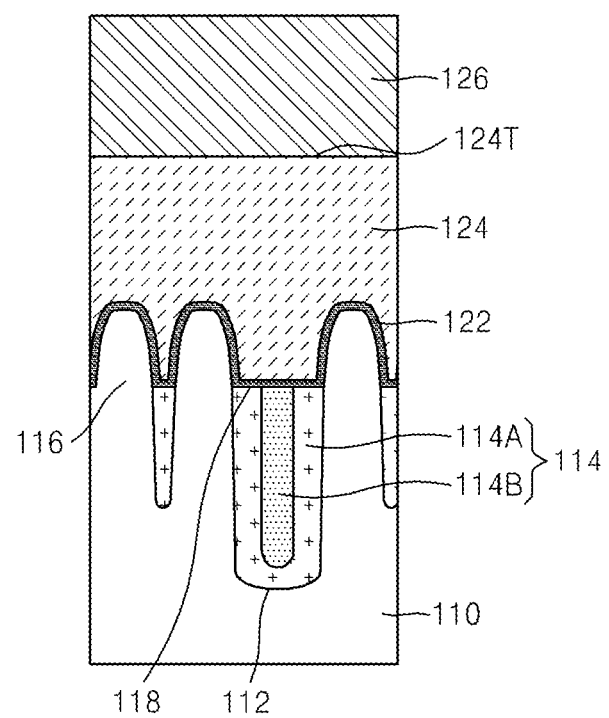
Figure 6C:
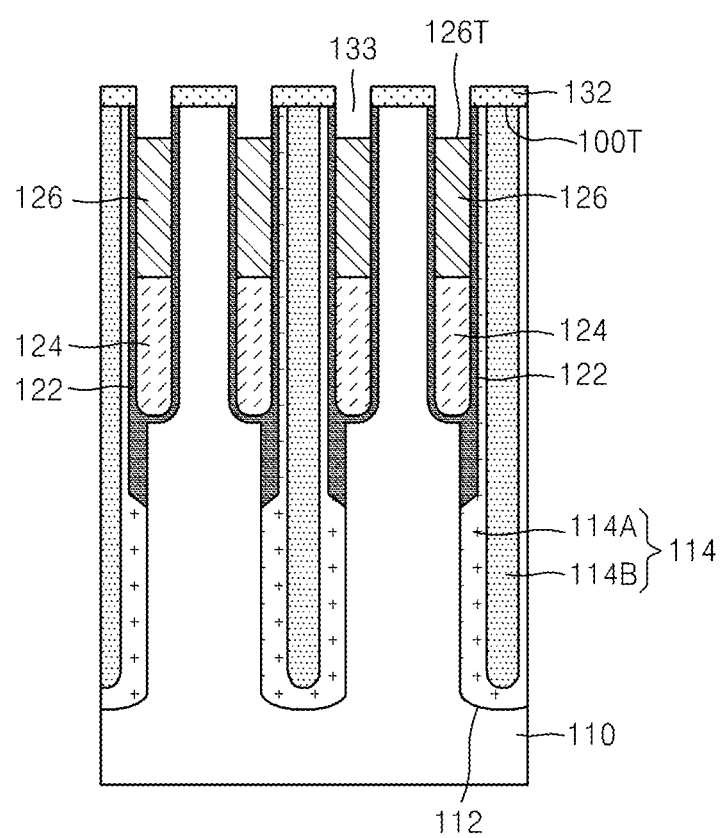
Figure 6D:
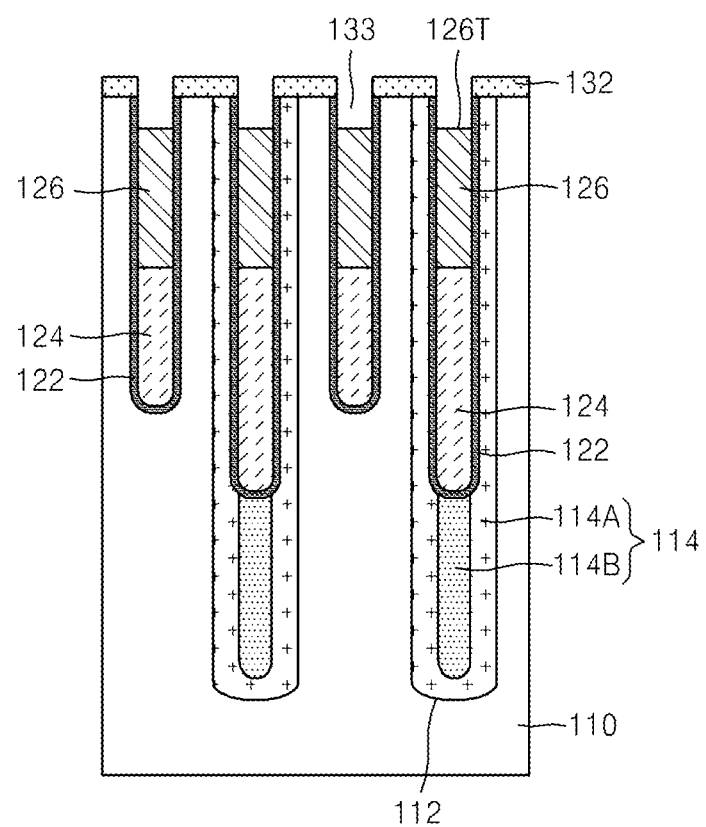
Figure 6E:
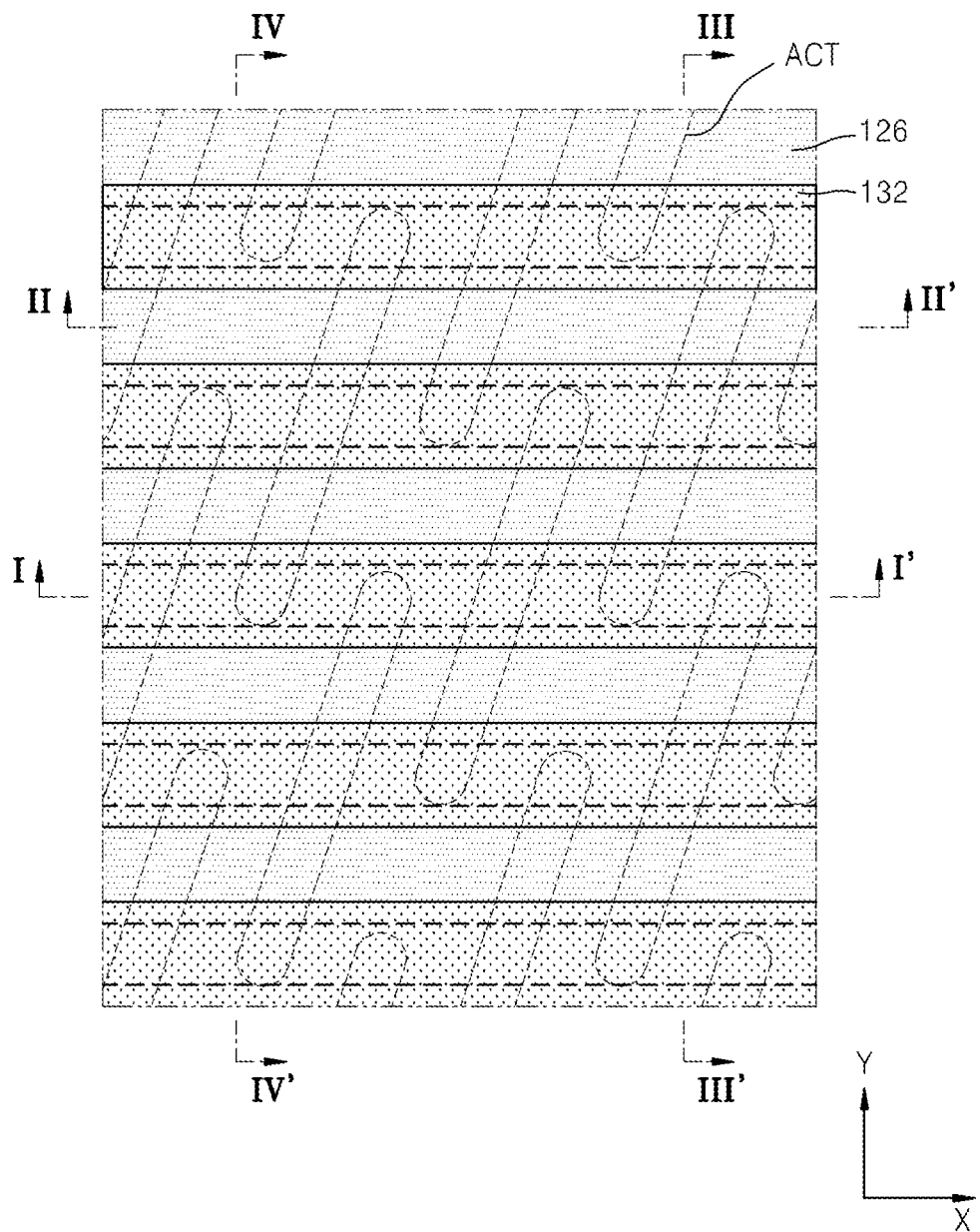
Figure 7A:
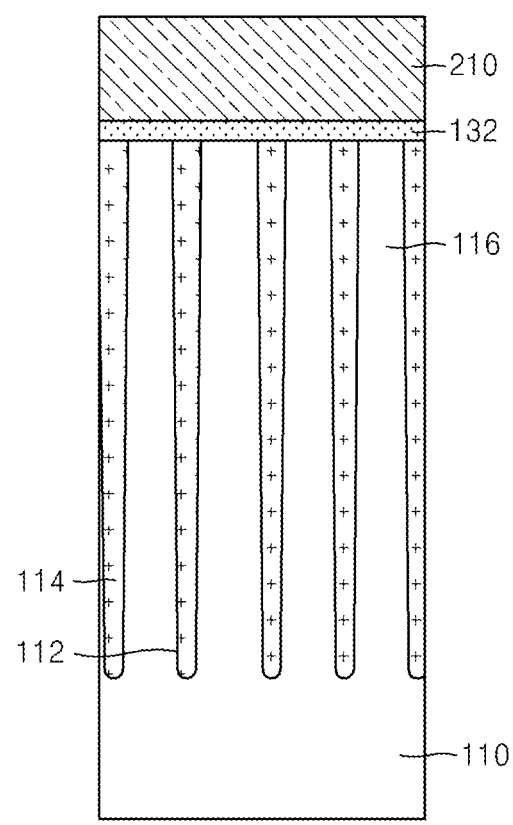
Figure 7B:
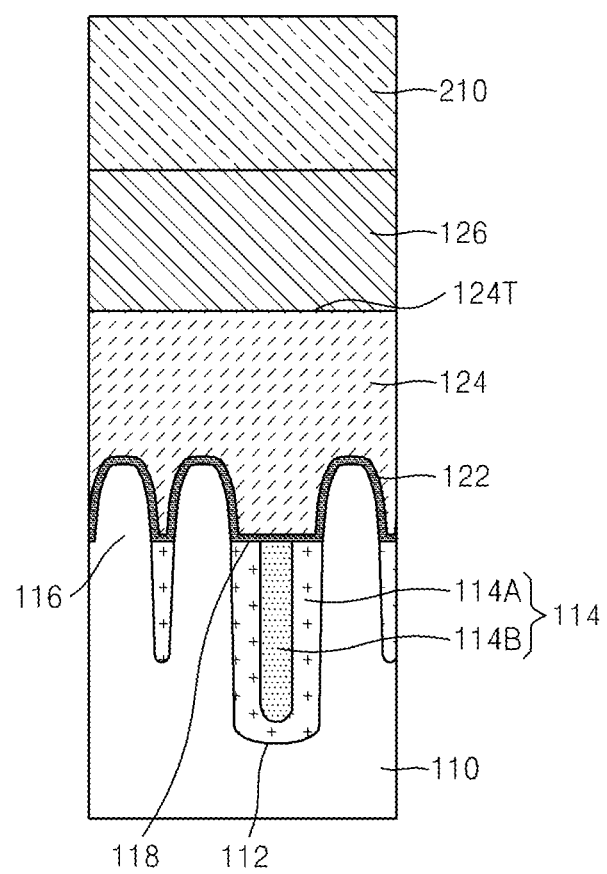
Figure 7C:
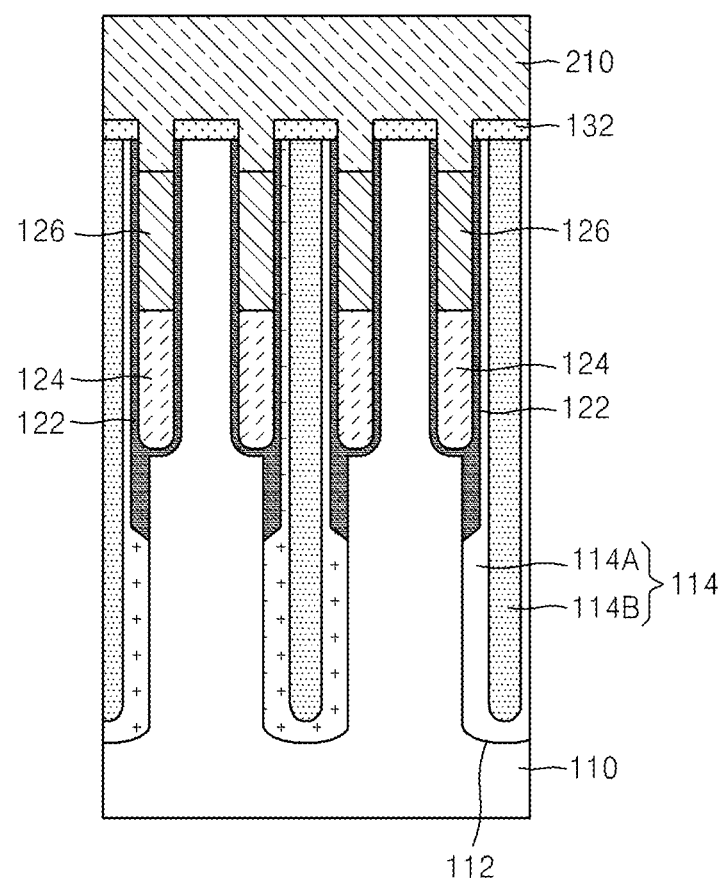
Figure 7D:
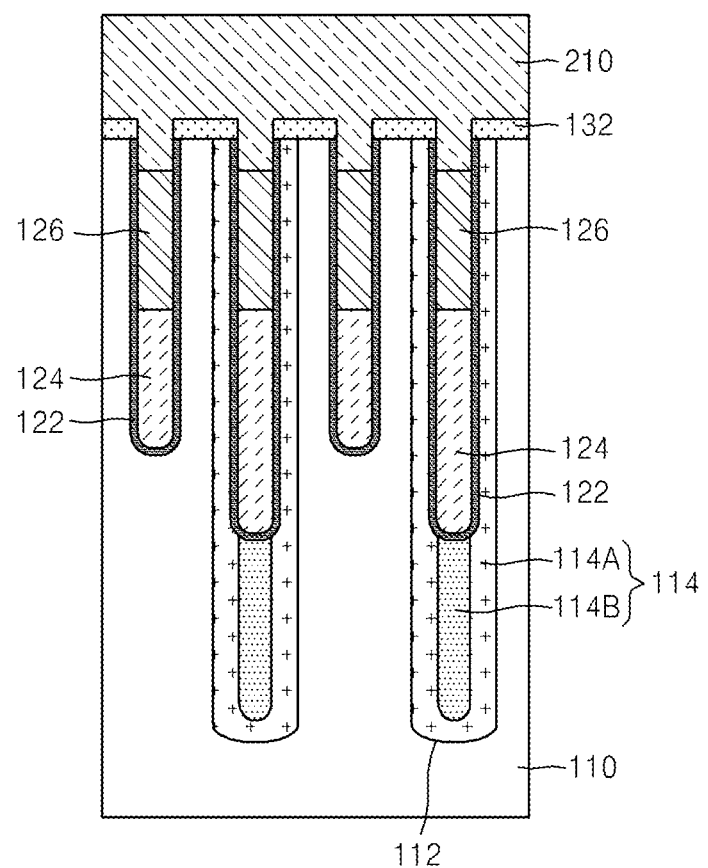
Figure 9A:
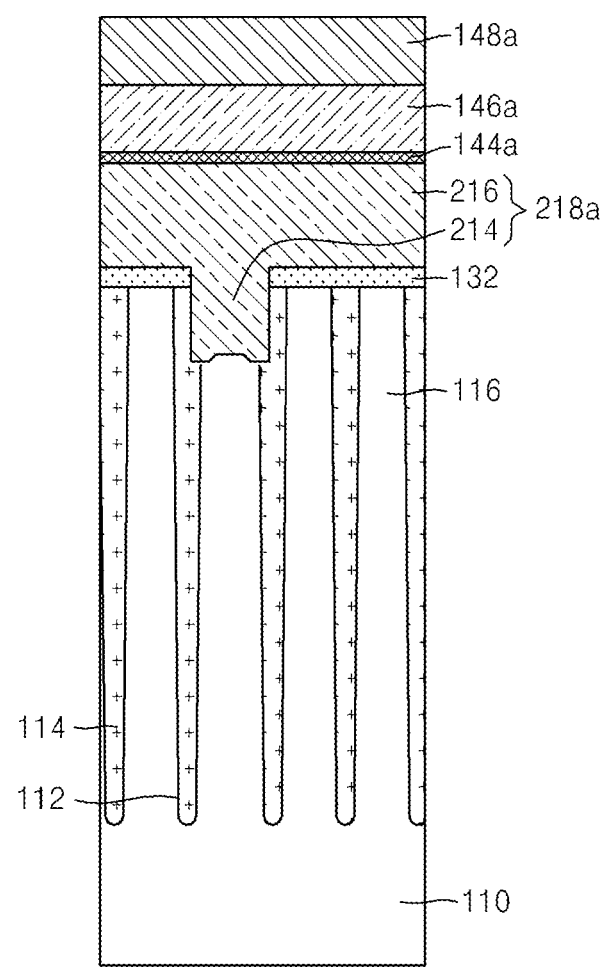
Figure 9B:
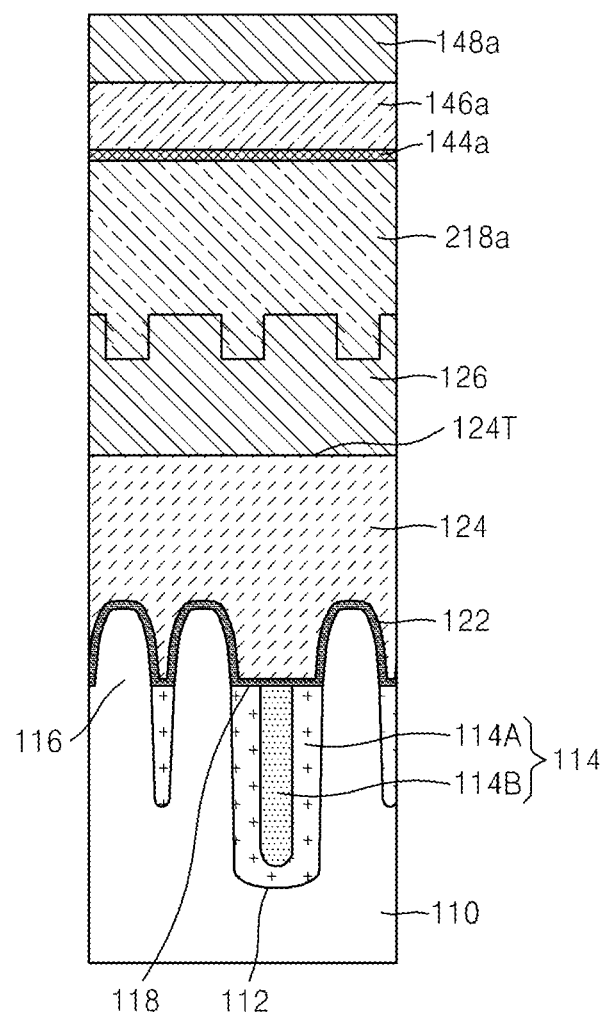
Figure 9C:
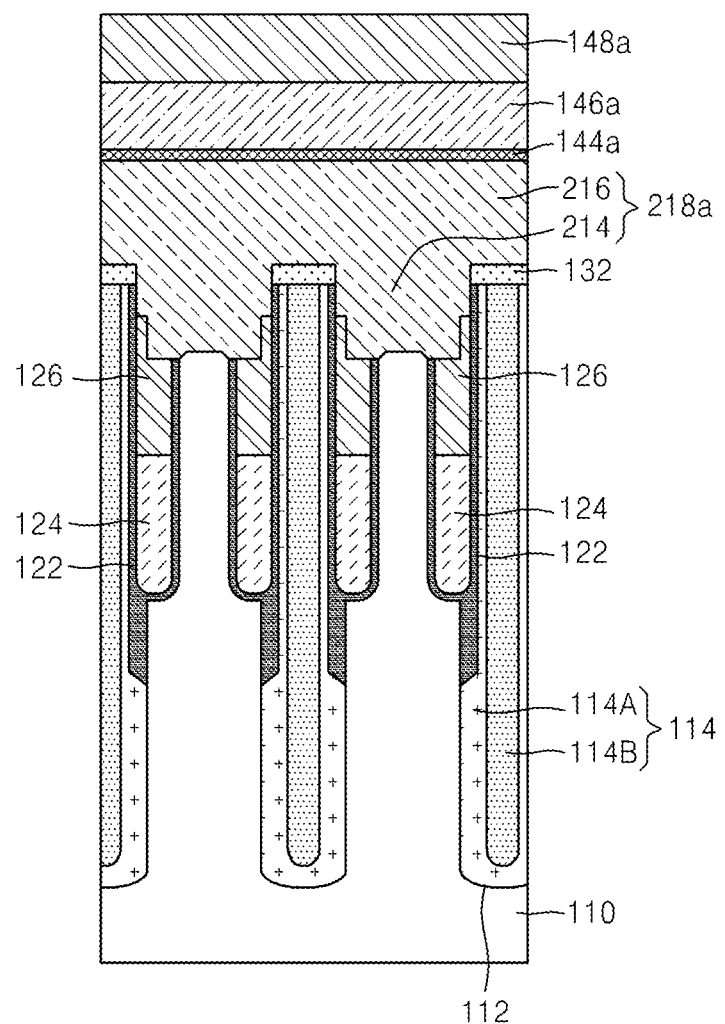
Figure 9D:
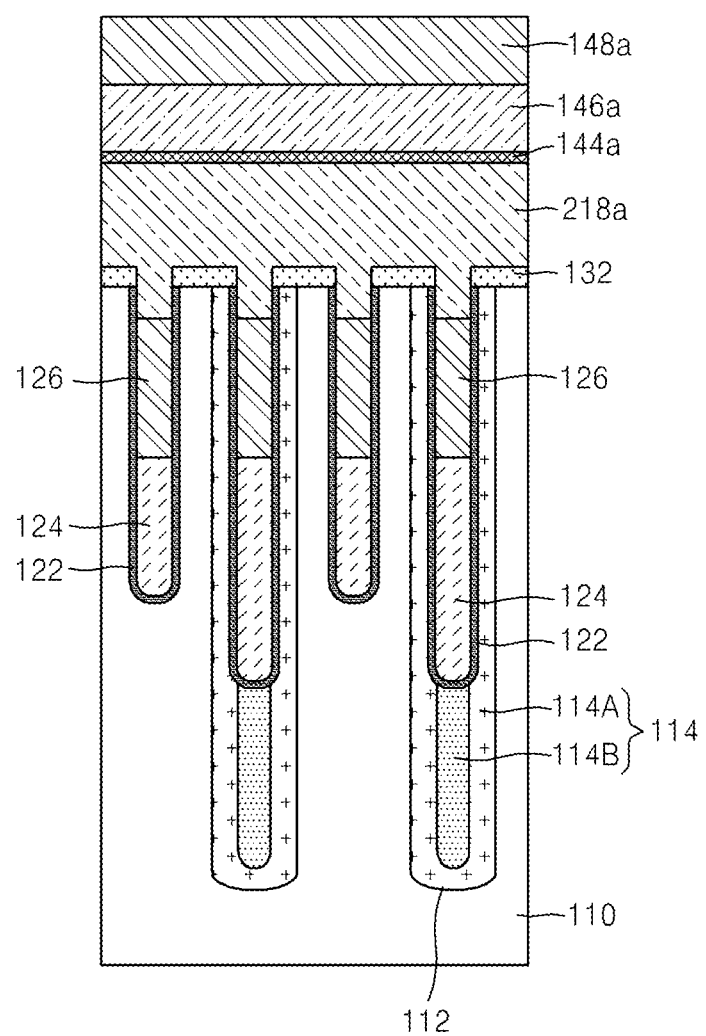
Figure 9E:
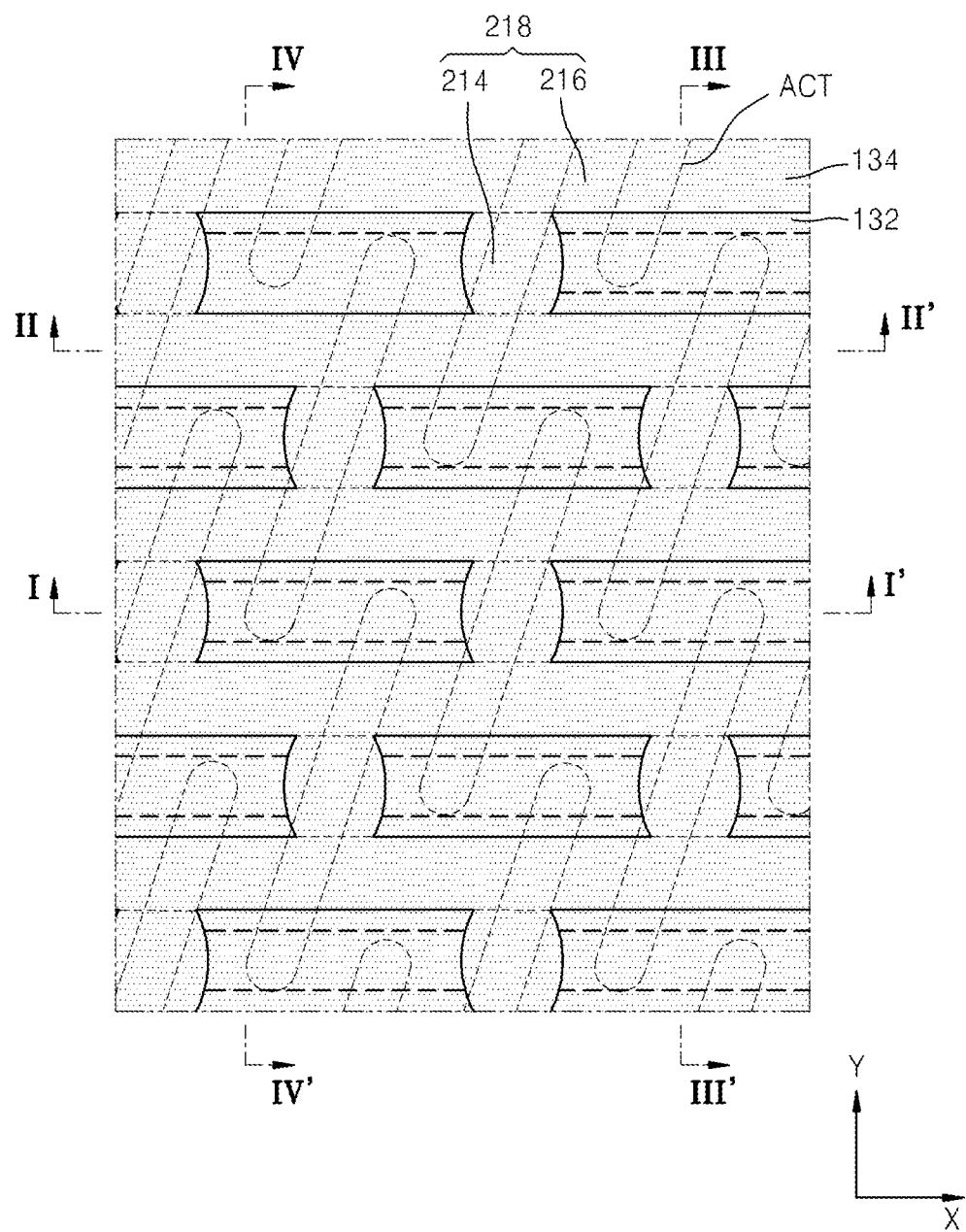
Figure 10A:
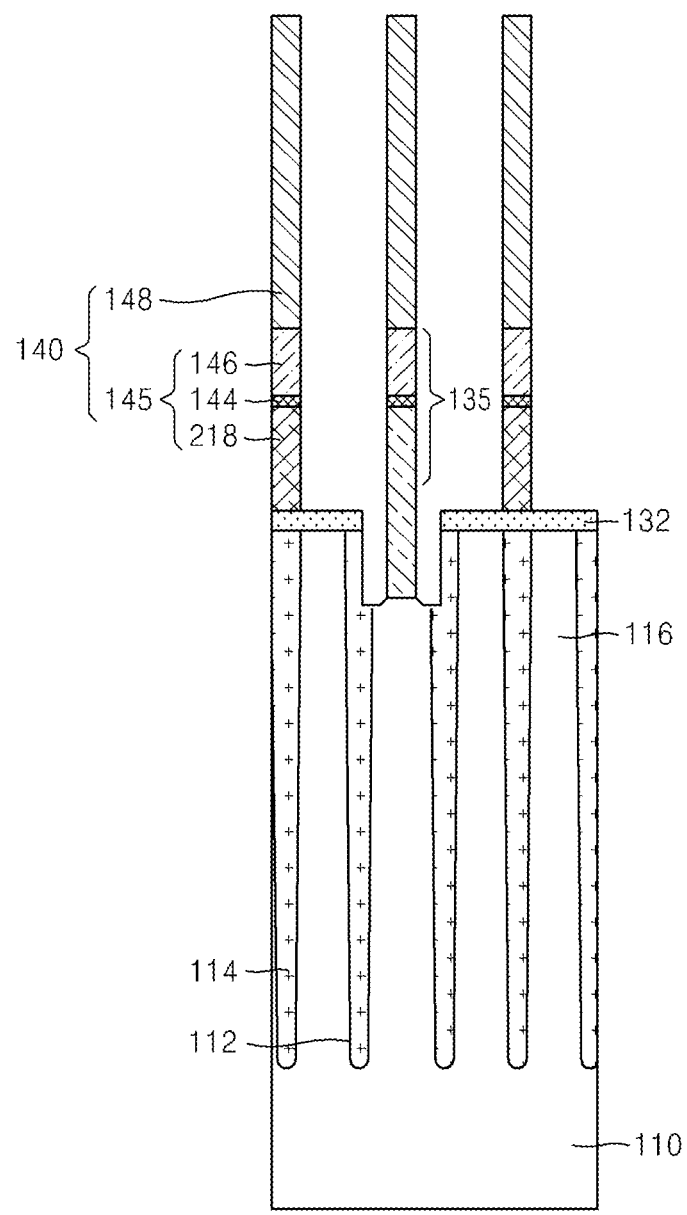
Figure 10B:
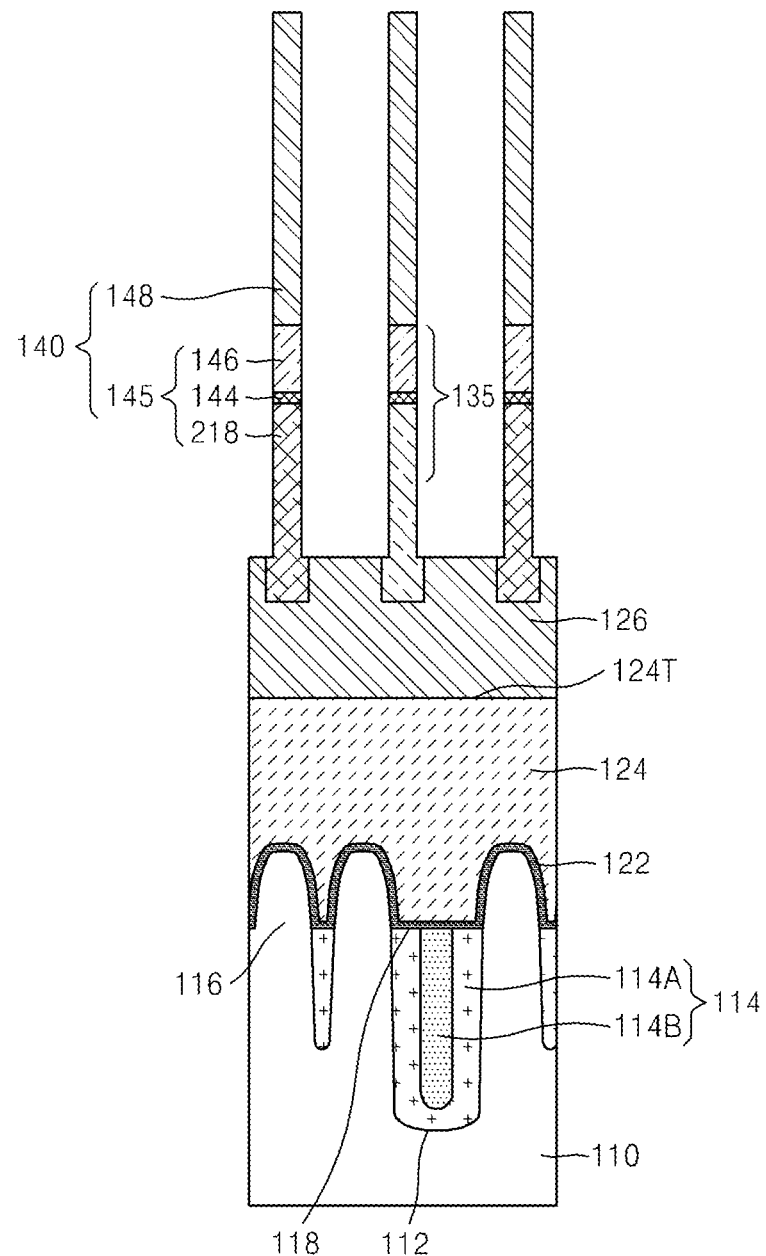
Figure 10C:
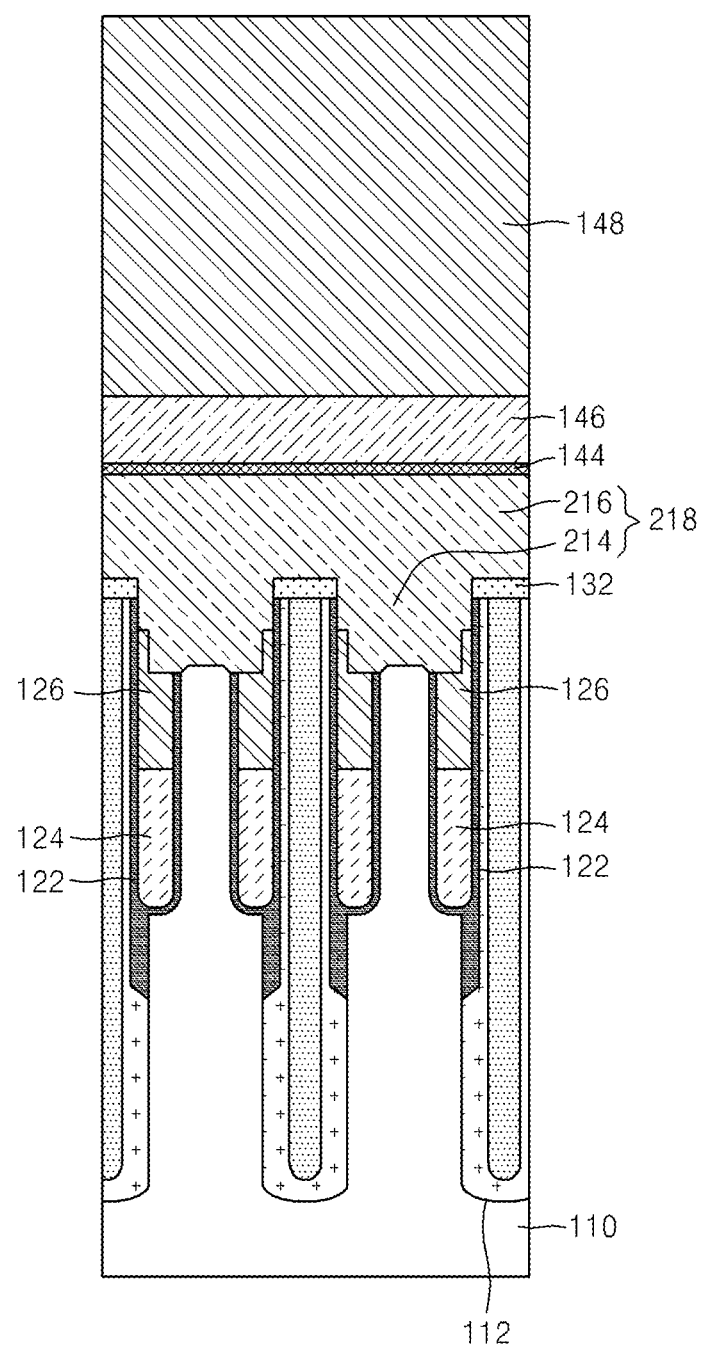
Figure 10D:
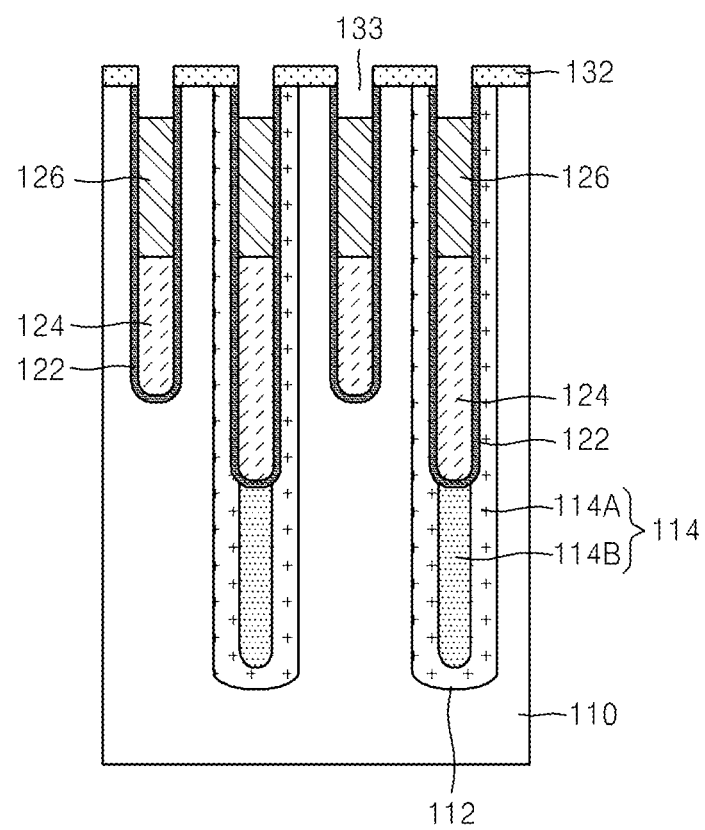
Figure 10E:
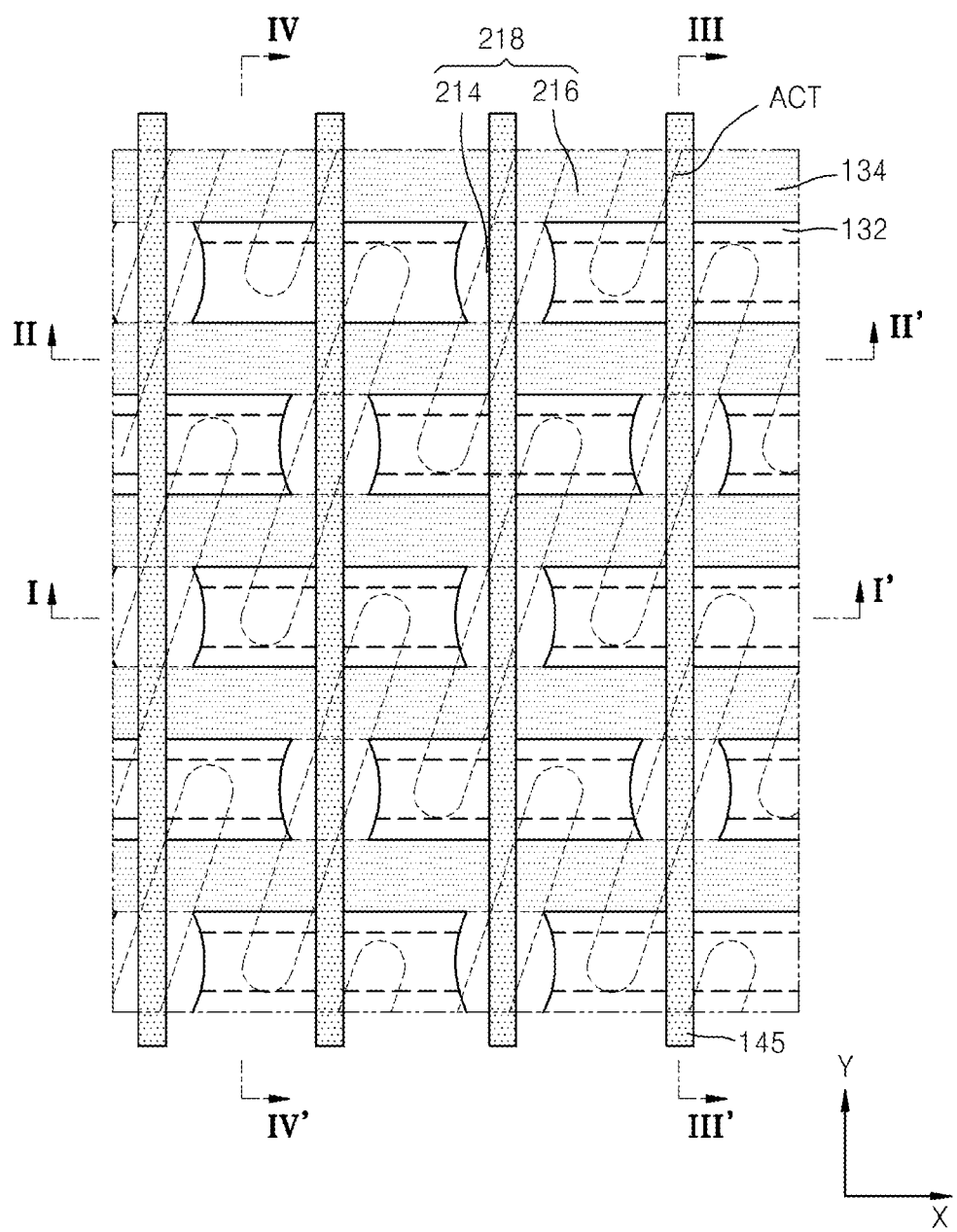
Figure 10F:
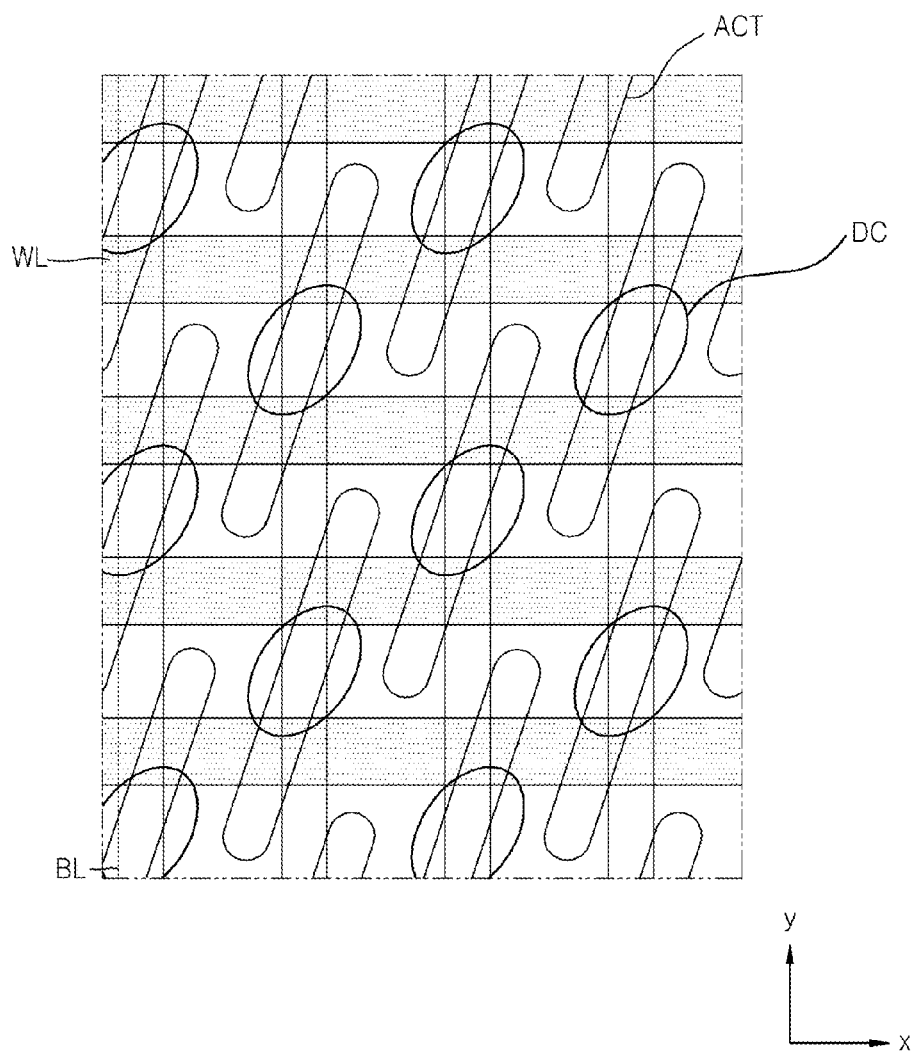
Figure 11A:
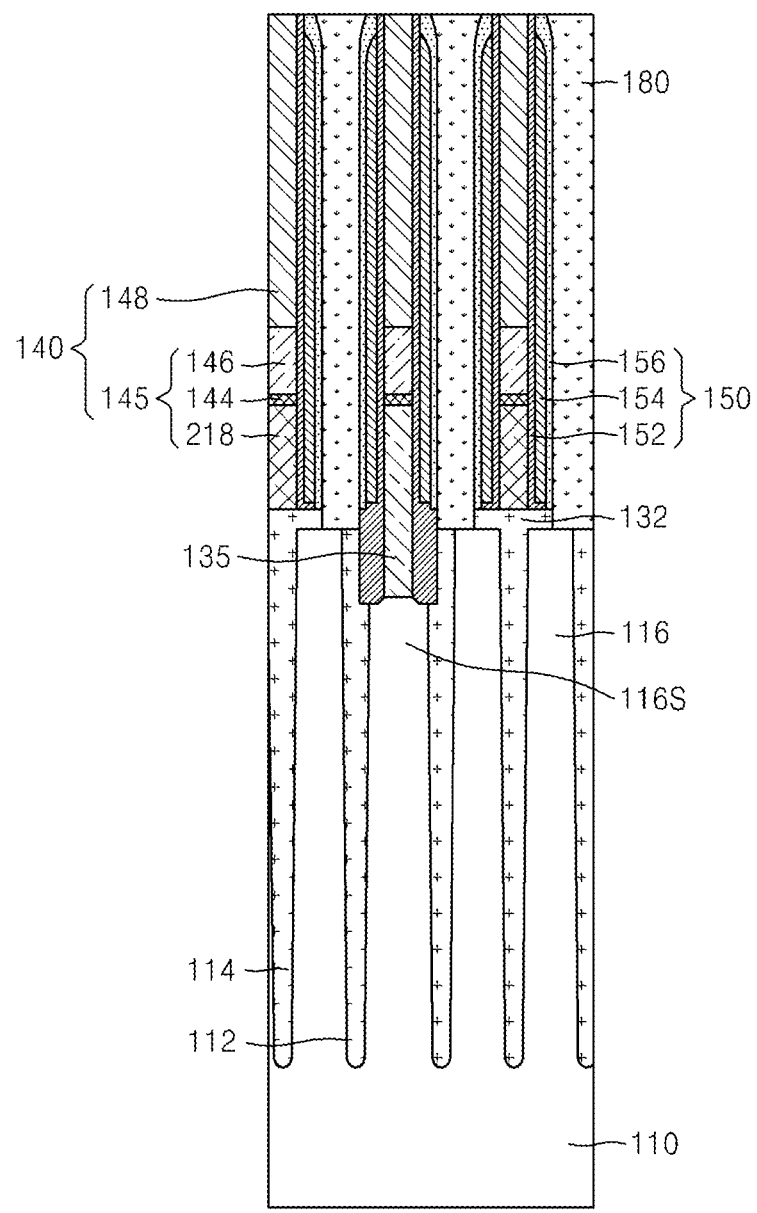
Figure 11B:
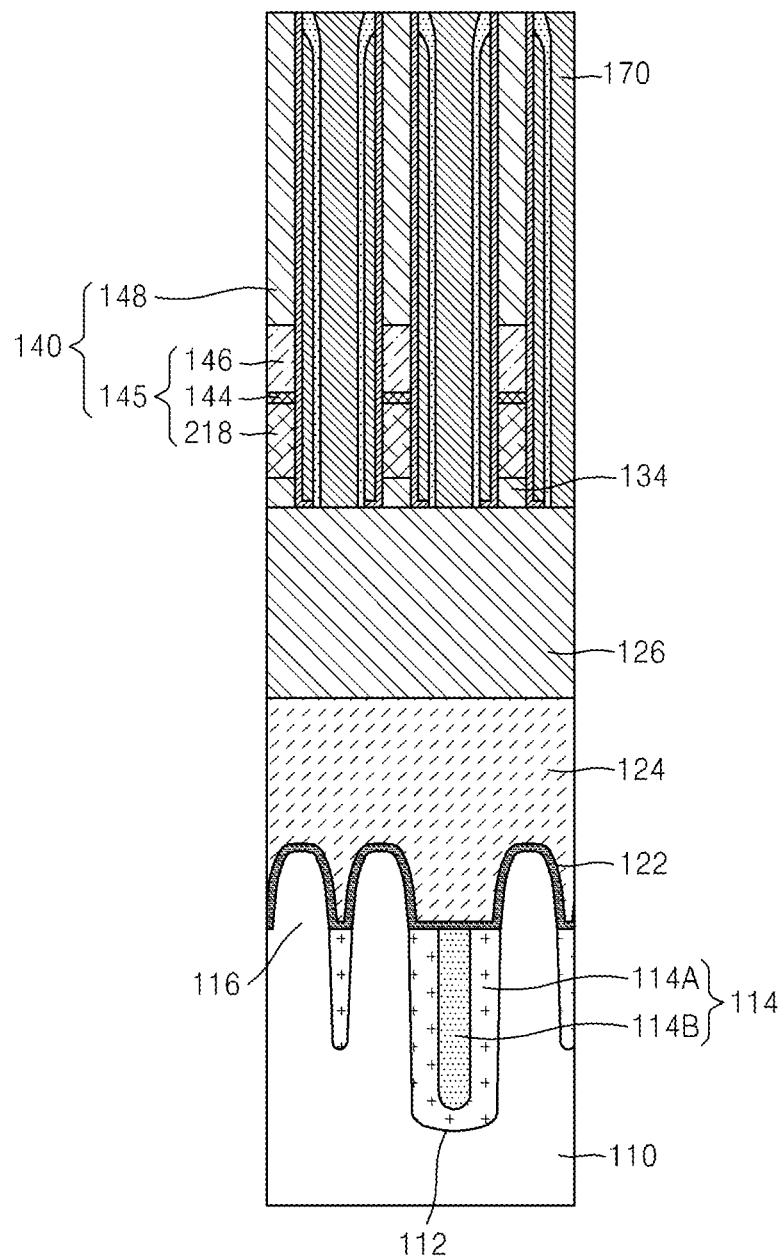
Figure 11C:
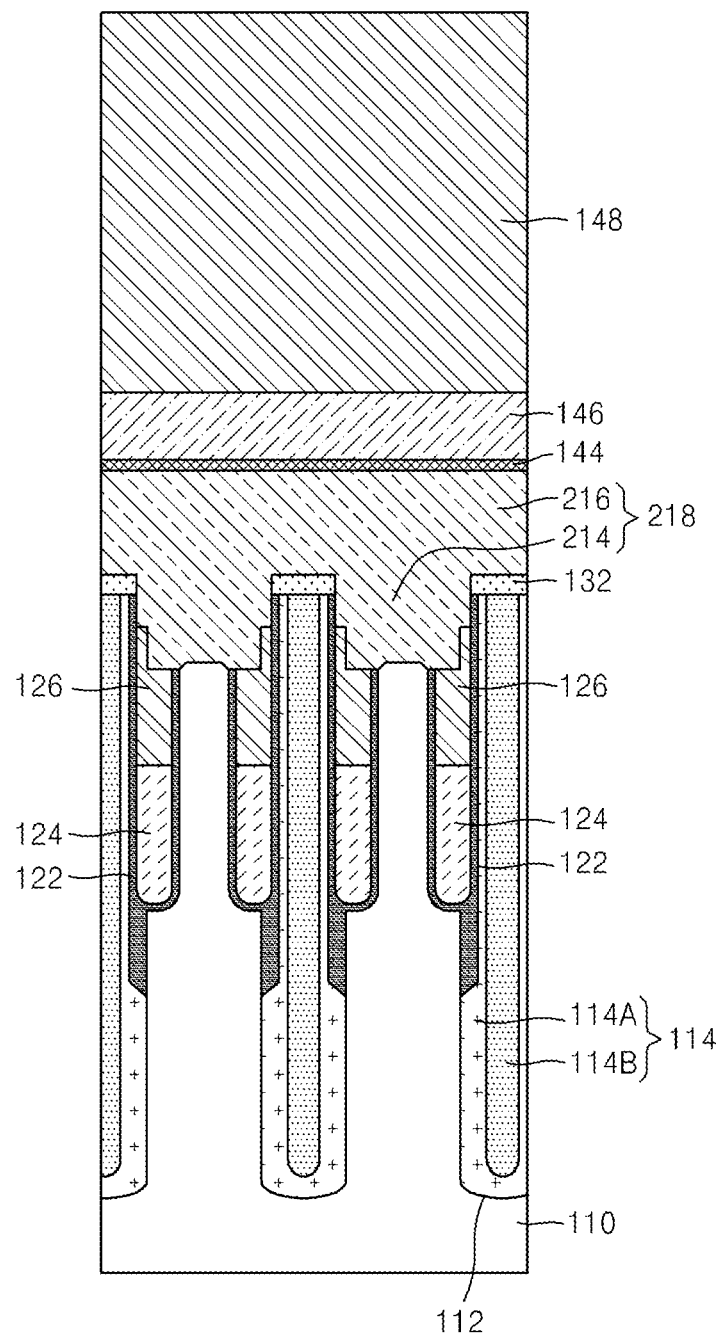
Figure 11D:
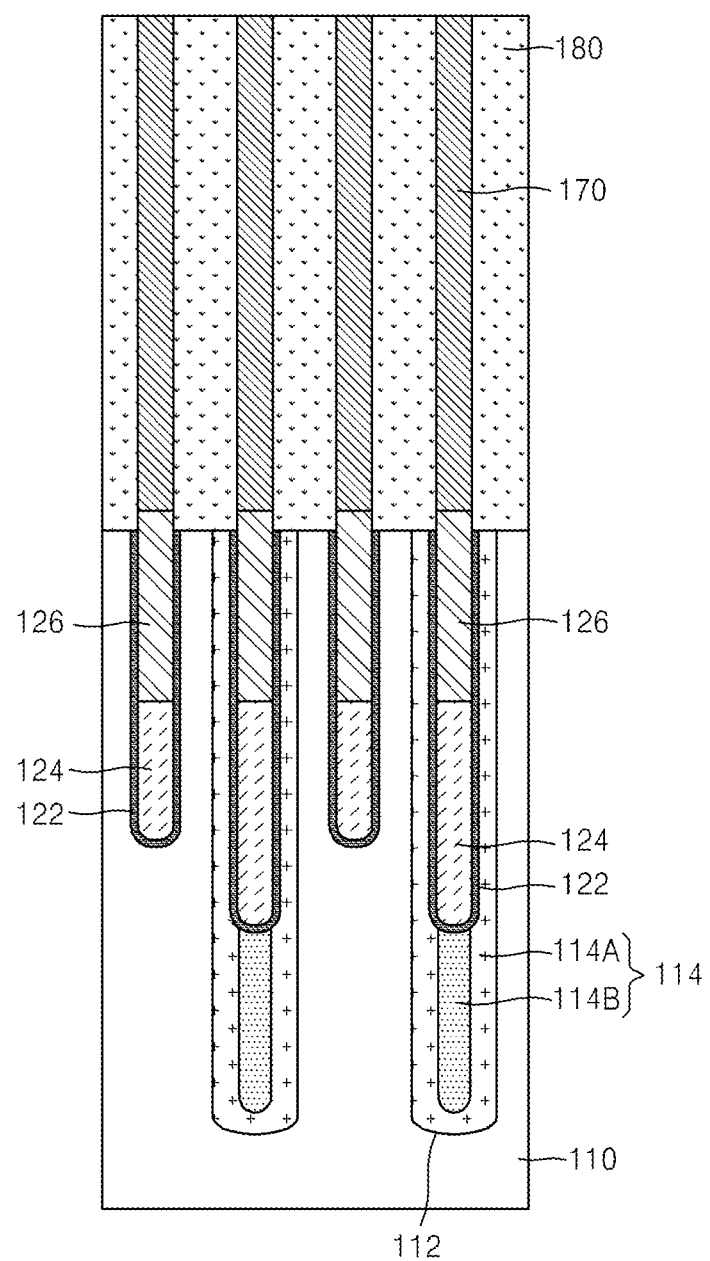
Figure 12A:
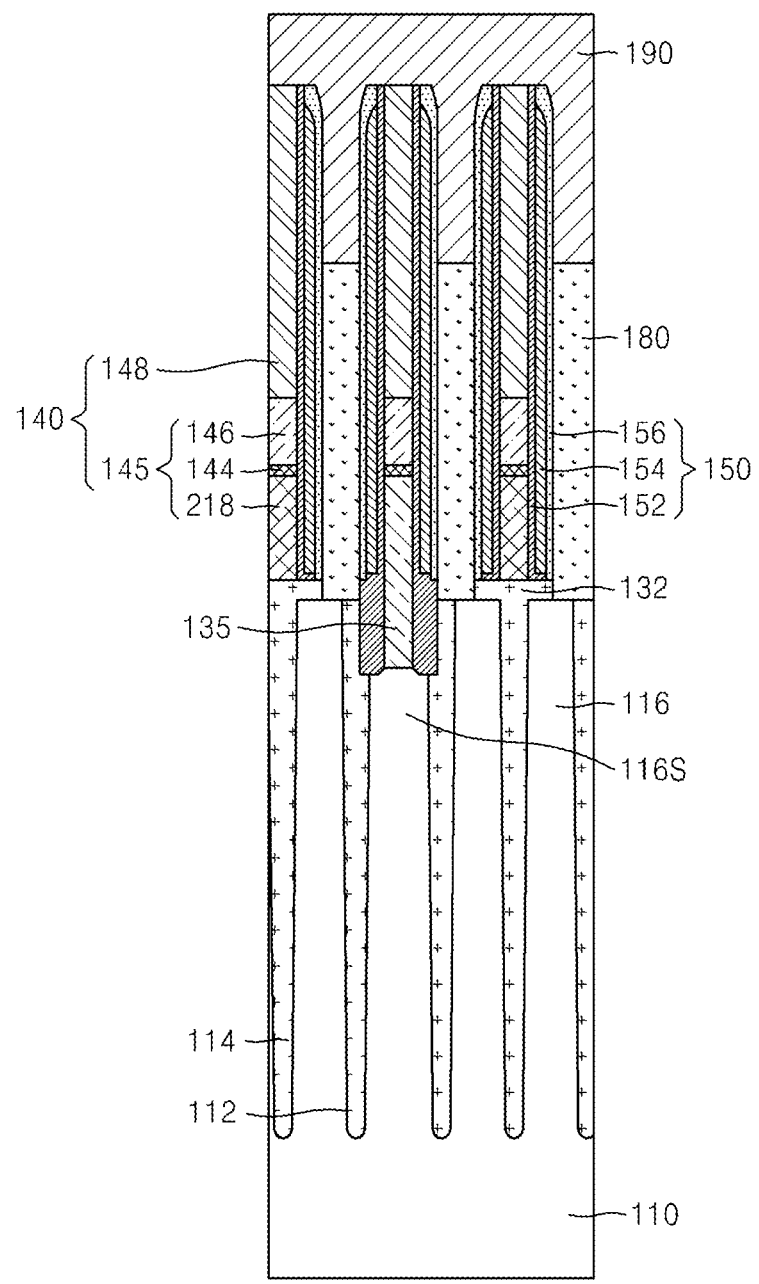
Figure 12B:
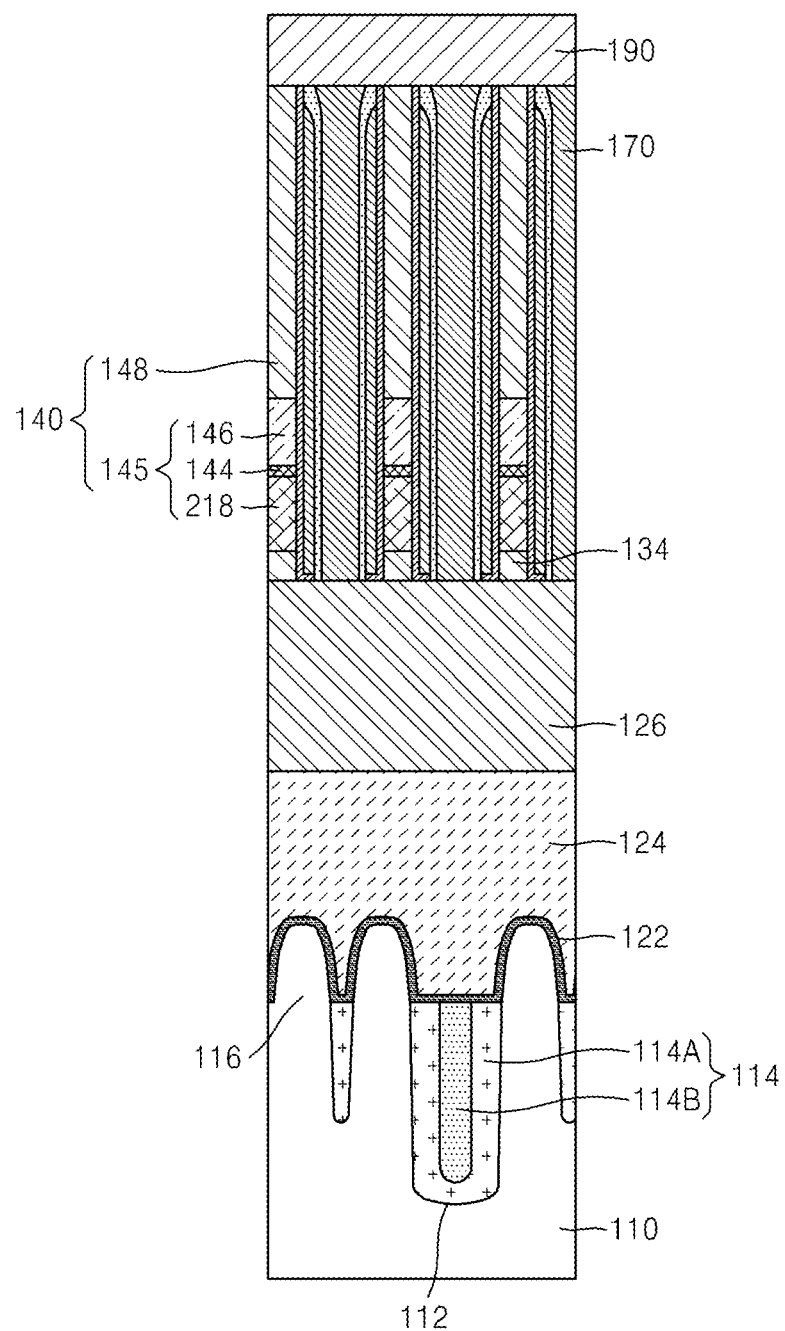
Figure 12C:
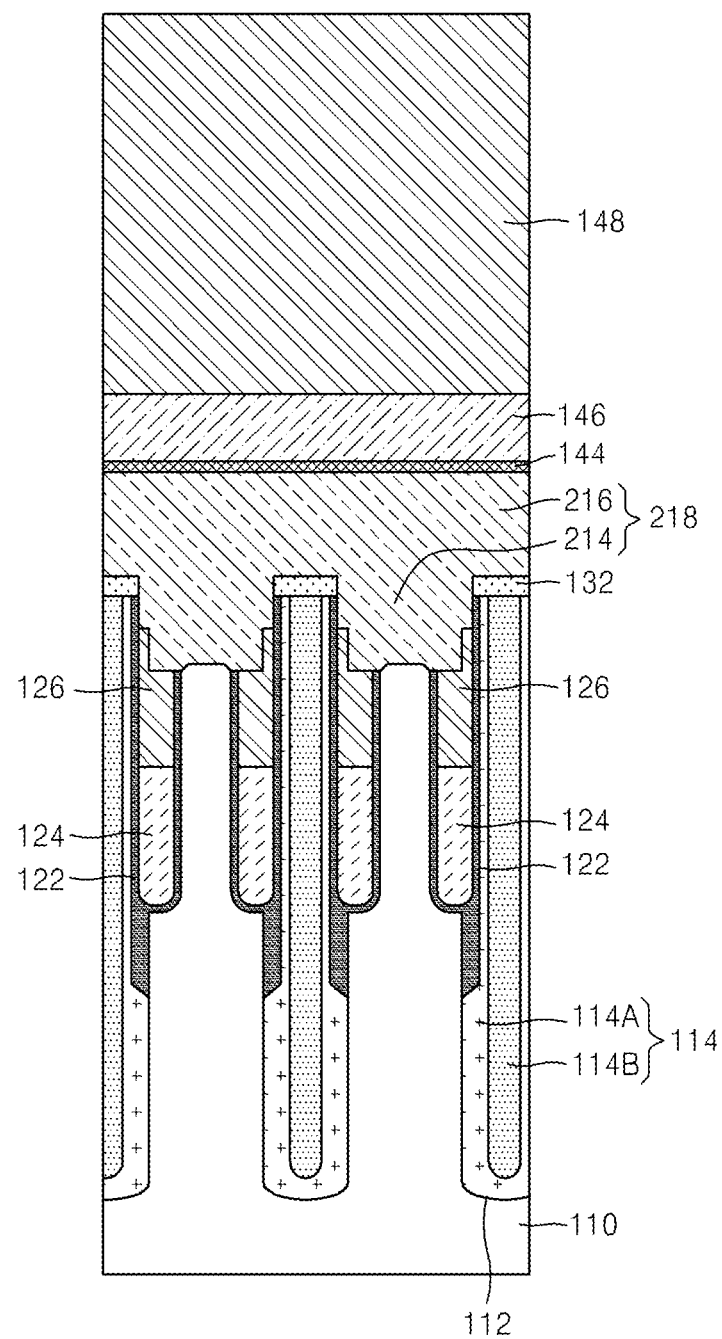
Figure 12D:
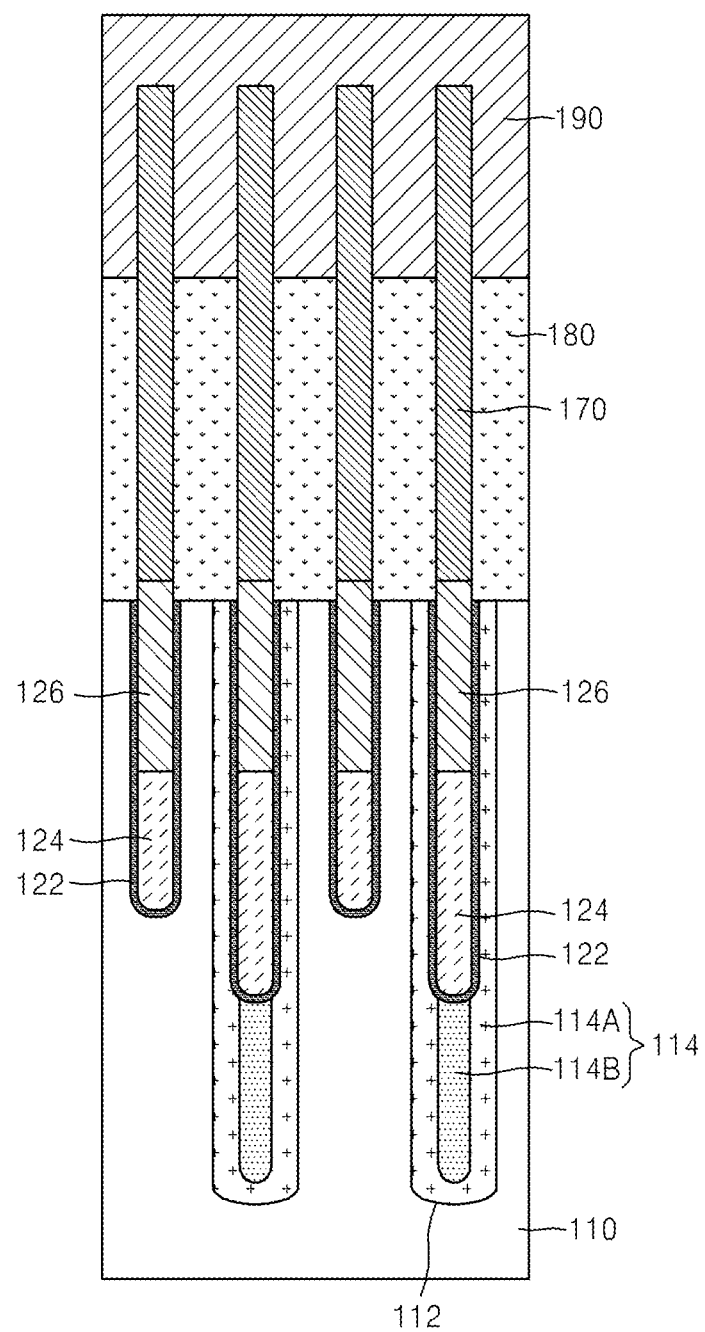

FIGS. 6A, 7A, . . . , 13A are cross-sectional views taken along line I-I' of FIG. 5; FIGS. 6B, 7B, . . . , 13B are cross-sectional views taken along line II-II' of FIG. 5; FIGS. 6C, 7C, . . . , 13C are cross-sectional views taken along line III-III' of FIG. 5; and FIGS. 6D, 7D, . . . , 13D are cross-sectional views taken along line IV-IV' of FIG. 5. FIGS. 6E, 7E, 8E, 9E, and 10E to 10F are schematic plan views for illustrating relevant processes, and I-I', II-II', III-III', and IV-IV' in the respective FIGS. denote the same portions as in FIG. 5. FIG. 10F illustrates a modification of FIG. 10E.

Referring to FIGS. 6A to 6E, an isolation trench 112 may be formed in a substrate 110, and an isolation layer 114 may be formed in the isolation trench 112. An active region 116 may be defined in the substrate 110 by the isolation layer 114. As illustrated in FIGS. 5 and 6, the active region 116 may have an island shape having a minor axis and a major axis, and may be disposed in the shape of a diagonal line or oblique line to have an angle of less than about 90° with respect to a word line 124 to be formed at an upper portion thereof.

The substrate 110 may include silicon (Si), for example, crystalline Si, polycrystalline Si, or amorphous Si. In some example embodiments, the substrate 110 may include germanium (Ge), or a compound semiconductor (e.g., SiGe, silicon carbide (SiC), gallium arsenide (GaAs), indium arsenide (InAs), or indium phosphide (InP)). In some example embodiments, the substrate 110 of the semiconductor device 100 may include a conductive region, for example, a doped well or a doped structure.

The isolation layer 114 may be formed of one insulating layer, or the isolation layer 114 may include an outer insulating layer 114A and an inner insulating layer 114B as illustrated in FIGS. 6B to 6D. The outer insulating layer 114A and the inner insulating layer 114B may be formed of different materials. For example, the outer insulating layer 114A may be formed of an oxide layer, and the inner insulating layer 114B may be formed of a nitride layer. However, the configuration of the isolation layer 114 is not limited thereto. For example, the isolation layer 114 may be formed in a multilayer structure including a combination of at least three types of insulating layers.

A plurality of word line trenches 118 may be formed at the substrate 110. The word line trenches 118 may extend in parallel to each other, and may have a linear shape extending across the active region 116. As illustrated in FIG. 6B, in order to form the word line trench 118 having a trench portion formed at a bottom surface thereof, the isolation layer 114 and the substrate 110 may be etched by separate etching processes such that the etched depth of the isolation layer 114 is different from the etched depth of the substrate 110.

The resulting structure including the word line trench 118 may be cleaned, and then a gate dielectric layer 122, a word line 124, and a buried insulating layer 126 may be sequentially formed in the word line trench 118. Because the buried insulating layer 126 is formed on the word line 124, the configuration and shape of the buried insulating layer 126 may be identical to the configuration and shape of the word line 124 as illustrated in FIG. 6E.

In some example embodiments, after forming the word line 124, by using the word line 124 as a mask, dopant ions may be implanted into the substrate 110 at both sides of the word line 124 to form a source and drain regions (not shown) at a top surface of the active region 116. A direct contact DC may be connected to the source region. In other example embodiments, the dopant ion implantation process for forming the source and drain regions may be performed before the forming of the word line 124.

A top surface 124T of the word line 124 may be lower than a top surface 110T of the substrate 110 and/or a bottom surface of the word line 124 may have an uneven shape as illustrated in FIG. 6B. A saddle fin structure transistor (saddle FINFET) may be formed at the active region 116. In some example embodiments, the word line 124 may be formed of at least one of titanium (Ti), titanium nitride (TiN), tantalum (Ta), tantalum nitride (TaN), tungsten (W), tungsten nitride (WN), titanium silicon nitride (TiSiN), and tungsten silicon nitride (WSiN).

The gate dielectric layer 122 may be formed of at least one of a silicon oxide layer, a silicon nitride layer, a silicon oxynitride layer, oxide/nitride/oxide (ONO), and a high-k dielectric layer that has a higher dielectric constant than a silicon oxide layer. For example, the gate dielectric layer 122 may have a dielectric constant of about 10 to about 25. In some example embodiments, the gate dielectric layer 122 may be formed of at least one of hafnium oxide (HfO), hafnium silicon oxide (HfSiO), hafnium oxynitride (HfON), hafnium silicon oxynitride (HfSiON), lanthanum oxide (LaO), lanthanum aluminum oxide (LaAlO), zirconium oxide (ZrO), zirconium silicon oxide (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), and lead scandium tantalum oxide (PbScTaO). Also, the gate dielectric layer 122 may be formed of $HfO_2$, $Al_2O_3$, $HfAlO_3$, $Ta_2O_3$, or $TiO_2$.

An interlayer insulating layer 132 may be formed on the buried insulating layer 126, the substrate 110, and the isolation layer 114. The interlayer insulating layer 132 may be formed to expose the buried insulating layer 126. As illustrated in FIG. 6E, the interlayer insulating layer 132 may be formed to extend along one side of the buried insulating layer 126 in the first direction (X-axis direction). The interlayer insulating layer 132 may be formed of an oxide layer. In some cases, the interlayer insulating layer 132 may be formed of, for example, tetraethylorthosilicate (TEOS), high density plasma (HDP), or boro-phospho silicate glass (BPSG). The interlayer insulating layer 132 may have a thickness of about 200 Å to about 400 Å.

As illustrated in FIGS. 6B to 6E, the buried insulating layer 126 may be recessed to form a groove 133. In this case, a top surface 126T of the buried insulating layer 126 may be lower than the top surface 110T of the substrate 110. When the buried insulating layer 126 is recessed, a channel length may be increased. In some example embodiments, the buried insulating layer 126 may not be recessed. Thus, the top surface 126T of the buried insulating layer 126 may be located at substantially the same level as the top surface 110T of the substrate 110. The buried insulating layer 126 may be formed of, for example, a silicon oxide layer, a silicon nitride layer, a silicon oxynitride layer, or any combinations thereof. In the plan view of FIG. 6E, the hatches of the cross-sectional views of FIGS. 6A to 6D are discriminated for convenience' sake.

Referring to FIGS. 7A to 7E, a first lower interconnection layer 210 is formed on the interlayer insulating layer 132 and the buried insulating layer 126. The first contact interconnection layer 210 may be formed on the interlayer insulating layer 132 and the buried insulating layer 126. The first lower interconnection layer 210 may be formed to fill the groove 133.

Figure 7E:
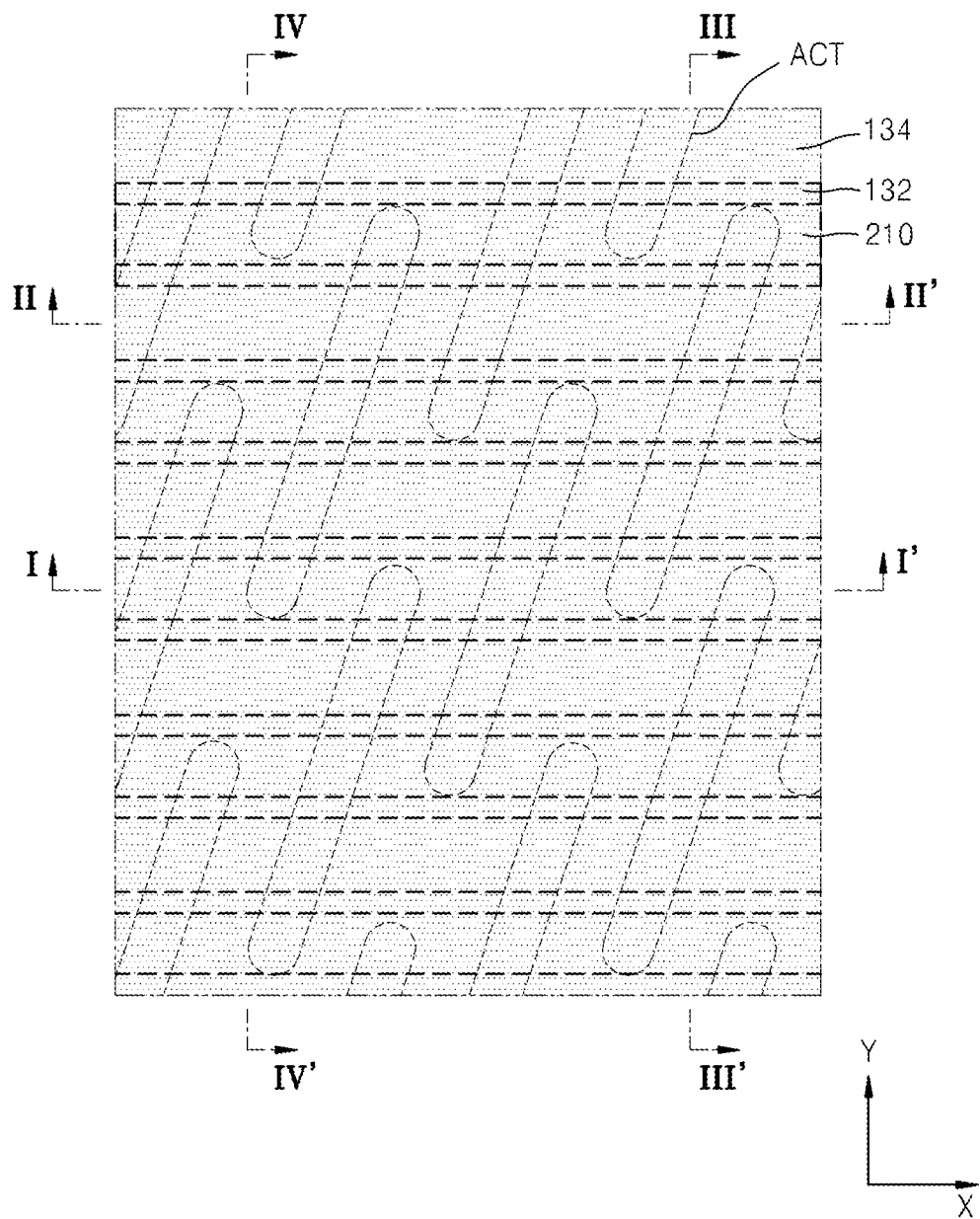

The first lower interconnection layer 210 may be formed of a conductive layer, for example, a metal layer. The first lower interconnection layer 210 may be formed of a doped polysilicon layer. In FIG. 7E, a reference numeral "134" (hereinafter, referred to as a buried insulating layer pattern) may denote a portion of the first lower interconnection layer 210 that is formed on the buried insulating layer 126 on the word line WL.

Referring to FIGS. 8A to 8E, a mask pattern 212 is formed on the first lower interconnection layer 210. The mask pattern 212 may be a photoresist pattern that is formed by a photo process. For example, the mask pattern 212 may be formed by forming a photoresist layer (not illustrated) on the first lower interconnection layer 210 and exposing and developing the photoresist layer.

By using the mask pattern 212 as an etch mask, the first lower interconnection layer 210, the interlayer insulating layer 132, and substrate 110 may be etched to form a plurality of contact holes 130H. The contact holes 130H may be formed to expose one surface of the interlayer insulating layer 132 and/or the substrate 110.

Figure 8A:
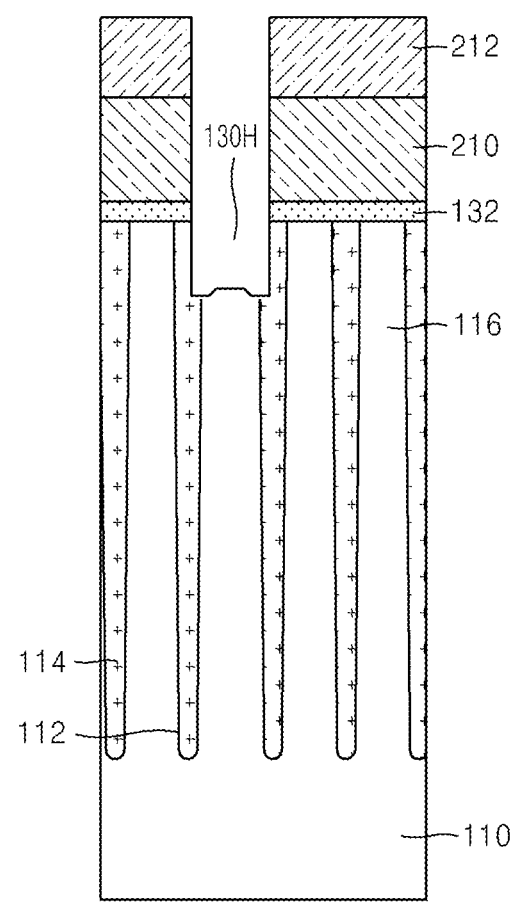
Figure 8B:
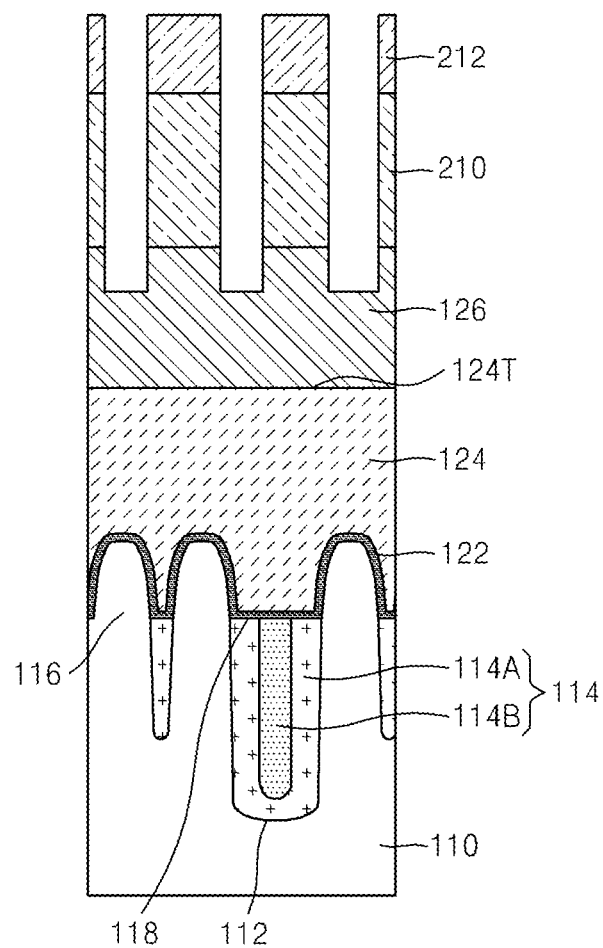
Figure 8C:
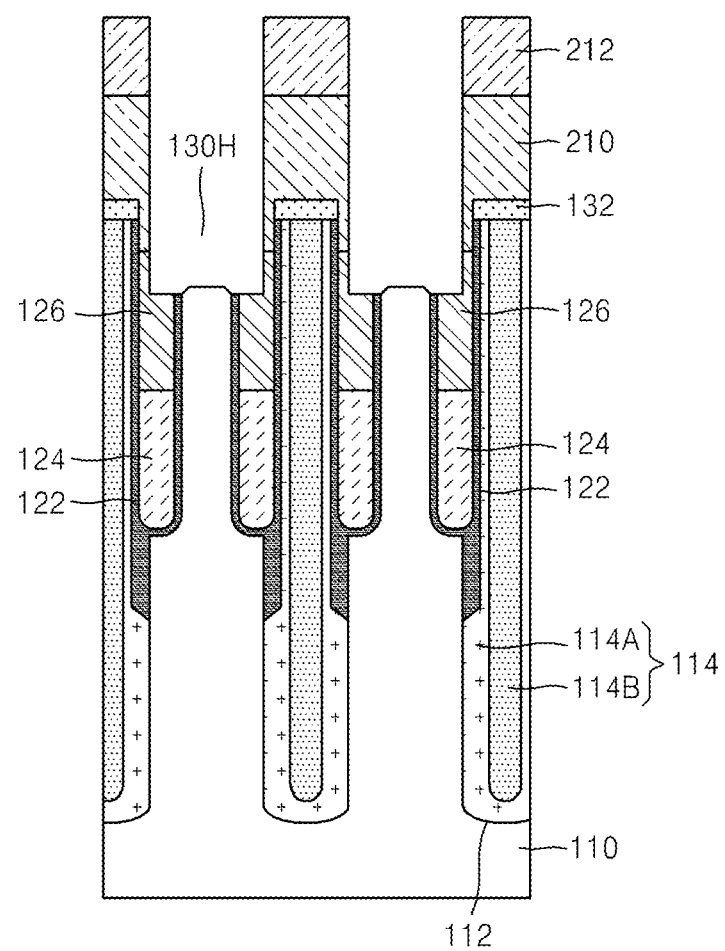
Figure 8D:
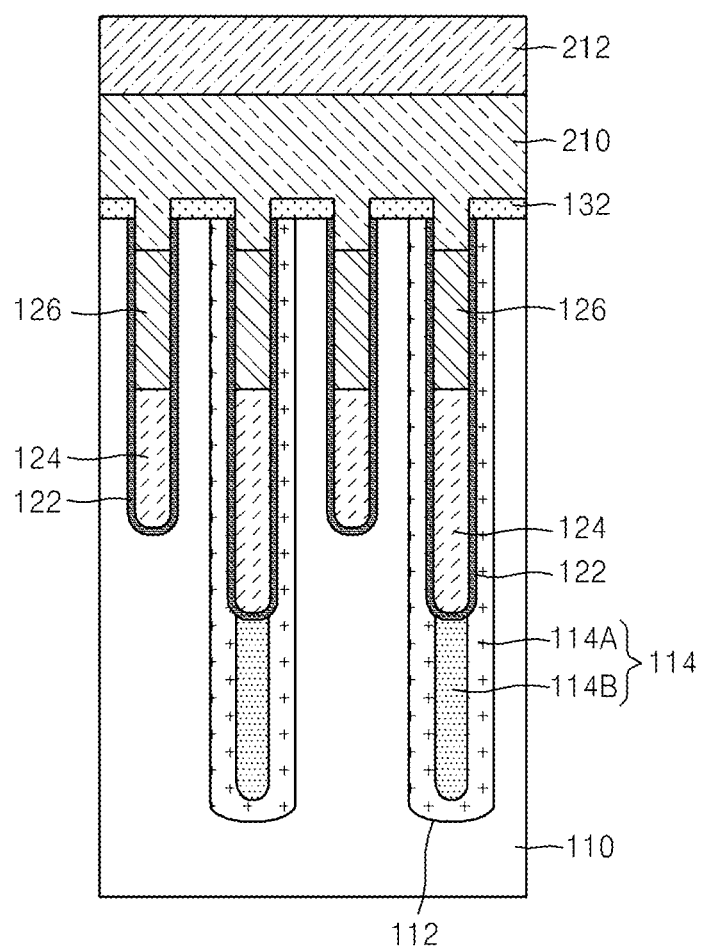
Figure 8E:
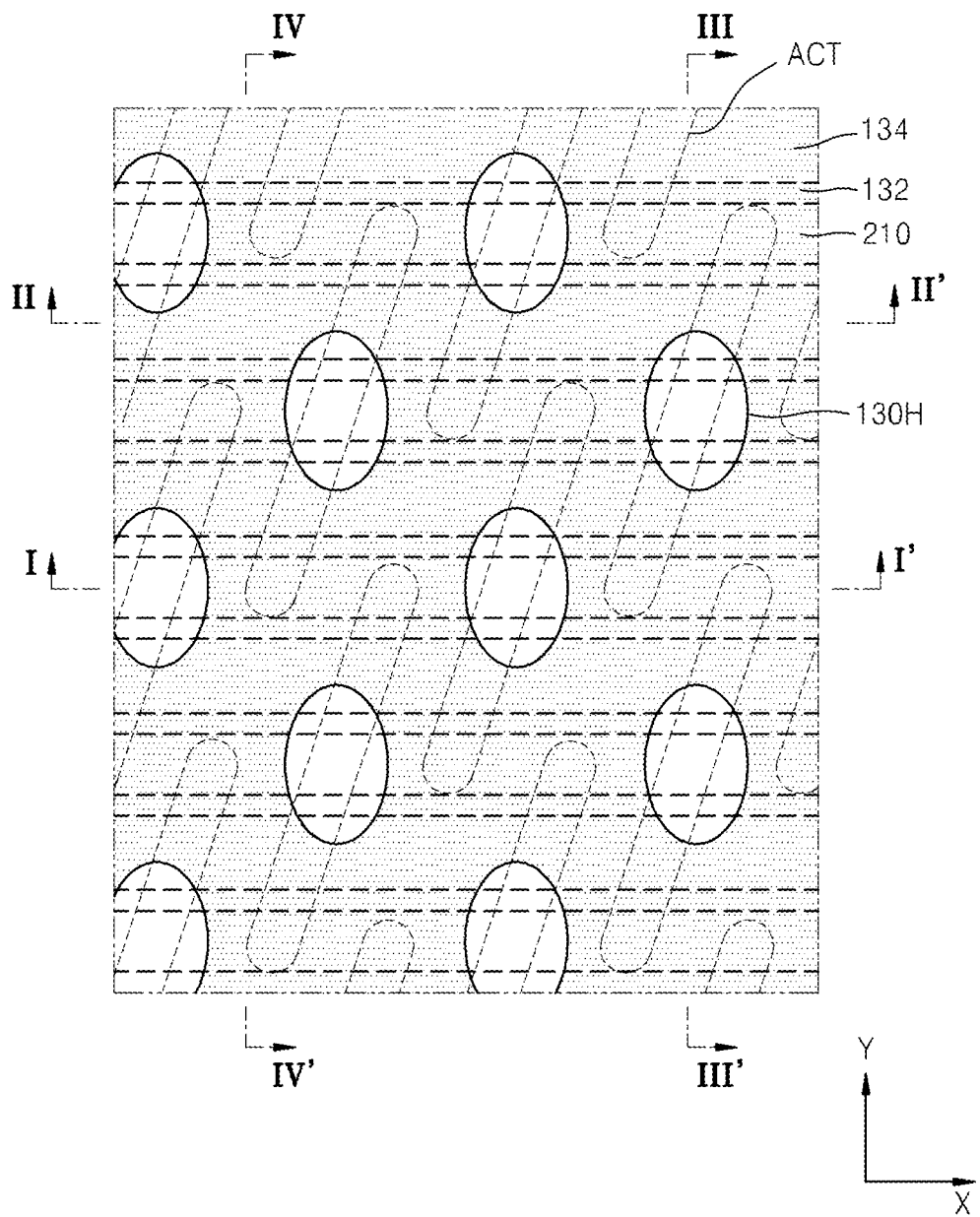

As illustrated in FIG. 8E, the contact holes 130H may be spaced apart from each other in the first direction (X-axis direction) and the second direction (Y-axis direction). Also, as illustrated in FIG. 8E, the contact holes 130H may be spaced apart from each other in the first direction (X-axis direction) and the second direction (Y-axis direction) while being formed between the buried insulating layer patterns 134. The contact holes 130H may expose the source region (not shown) of the active region 116.

Referring to FIGS. 9A to 9E, the mask pattern 212 may be removed. Thereafter, a second lower interconnection layer may be formed on the first lower interconnection layer 210 to fill the contact holes 130H. The second lower interconnection layer may be formed on the substrate 110. After forming the second lower interconnection layer, the second lower interconnection layer may be etched back. The second lower interconnection layer may be formed of a conductive layer, for example, a metal layer. The second lower interconnection layer may be formed of a doped polysilicon layer.

In FIGS. 9A to 9E, a resultant structure of the first lower interconnection layer 210 and the second lower interconnection layer are collectively illustrated and collectively referred to as a lower interconnection layer "218a". The lower interconnection layer 218a may be formed on the interlayer insulating layer 132 and the buried insulating layer 126 to fill the contact holes 130H.

As illustrated in FIGS. 3A, 3C, and 3E, the lower interconnection layer 218a may include isolated contact filling portions 214 and an etch control portion 216. The isolated contact filling portions 214 may refer to a portion of the lower interconnection layer 214 that fills the contact holes 130H. The isolated contact filling portions 214 may be located on the substrate 110 and spaced apart and isolated from each other in the first direction and the second direction. The etch control portion 216 may cover the isolated contact filling portions 214. The isolated contact filling portions 214 may refer to a portion of the lower interconnection layer 218a that fills the contact holes 130H.

The etch control portion 216 may refer to a portion of the lower interconnection layer 218a that does not fill the contact holes 130H. As will be described later, when forming the isolated contact filling patterns 214 by patterning the lower interconnection layer 218a, the etch control layer 216 may serve to control an etch rate of the isolated contact filling patterns 214 such that a profile of one sidewall of an interconnection pattern to be formed is vertical in a cross-sectional view.

Subsequently, upper interconnection layers 144a and 146a and a capping layer 148a may be formed on the lower interconnection layer 218a. The upper interconnection layers 144a and 146a may be formed on the isolated contact filling portions 214 and the etch control portion 216. The upper interconnection layers 144a and 146a may be formed of a conductive layer. The upper interconnection layers 144a and 146a may be formed of, for example, a tungsten layer. As illustrated in the drawings, the upper interconnection layers 144a and 146a may have a multilayer structure, for example, a stack structure in which a tungsten nitride layer 144a and a tungsten layer 146a are sequentially stacked. The capping layer 148a may be formed of an insulating layer. For example, the capping layer 148a may be formed of a nitride layer. In FIG. 9E, the upper interconnection layers 144a and 146a and the capping layer 148a are not illustrated for convenience' sake.

Referring to FIGS. 10A to 10F, the capping layer 148a, the upper interconnection layers 144a and 146a, and the second contact interconnection layer 218a may be photo-etched to form a bit line, a direct contact pattern 135, and a capping pattern 148 on the substrate 110. For example, the capping layer 148a, the upper interconnection layers 144a and 146a, the isolated contact filling portions 214, and the etch control portion 216 may be photo-etched to form the bit line 145, the direct contact pattern 135, and a capping pattern 148 on the substrate 110.

The bit line 145, the direct contact pattern 135, and the capping pattern 148 may be formed by the following process.

For example, a mask pattern (not illustrated) including a photoresist pattern formed by a photo process may be formed on the capping layer 148a. For example, the mask pattern may be formed by using a photoresist layer (not illustrated) on the capping layer 148a and exposing and developing the photoresist layer. By using the mask pattern as an etch mask, the capping layer 148a, the upper interconnection layers 144a and 146a, the isolated contact filling portions 214, and the etch control portion 216 may be etched to form the bit line 145, the direct contact pattern 135, and the capping pattern 148. The bit line 145 and the direct contact pattern 135 may constitute an interconnection pattern.

The bit line 145 may be formed by patterning the upper interconnection layers 144a and 146a and the lower interconnection layer 218a. Thus, the bit line 145 may be formed of a stack of the upper interconnection patterns 144a and 146a and the lower interconnection pattern 218, for example, a stack of a doped polysilicon layer, a tungsten nitride layer, and a tungsten layer. As illustrated in FIGS. 10E and 10F, the bit line 145 may be formed to be relatively narrow in the first direction and be relatively wide in the second direction. In FIG. 10E, the capping pattern 148 is not illustrated for convenience' sake.

The bit line 145 may be included in a bit line structure 140. The bit line structures 140 may be arranged in parallel to each other in the first direction (X-axis direction of FIG. 5) on the interlayer insulating layer 132 and the direct contact pattern 135. The bit line structure 140 may be installed to extend in the first direction. Each of the bit line structures 140 may include the bit line 145 and the capping pattern 148 that covers a top surface of the bit line 145. The bit line 145 may be electrically connected to the direct contact pattern 135. The capping pattern 148 may be formed of, for example, a silicon nitride layer. The thickness of the capping pattern 148 may be greater than the thickness of the bit line 145.

The direct contact pattern 135 may be formed by etching the isolated contact filling portions 214 of the lower interconnection layer 218a. The direct contact pattern 135 may be electrically connected to the source region (now shown) of the active region 116. Due to the etch control portion 216 in the lower interconnection layer 218a, a profile of one sidewall of the direct contact pattern 135 may be vertical in a cross-sectional view and linear in the second direction in a plan view. This has already been described with reference to FIG. 4F, and thus a description thereof will be omitted herein.

Referring to FIG. 10E, the direct contact holes 130H may be formed in parallel to the bit line 145 in the second direction as illustrated in FIGS. 5 and 8E. As illustrated in FIG. 10F, a direct contact hole DC may be formed to incline with respect to the bit line BL. Even when the direct contact hole DC is inclined with respect to the bit line BL, a profile of one sidewall of the direct contact pattern 135 may have a vertical shape.

Referring to FIGS. 11A to 11D, a multilayer spacer 150 may be formed at both sidewalls of the bit line structure 140. An insulating liner 152 may be formed to cover the exposed top surface and sidewalls of the bit line structure 140 and the exposed surface of the interlayer insulating layer 132 and fill a portion of the direct contact hole 130H. The insulating liner 152 may be used as a protection layer for protecting the bit line structure 140. The insulating liner 152 may be formed of, for example, a silicon nitride layer. The insulating liner 152 may be formed to have a thickness of, for example, about 30 Å to about 80 Å.

Subsequently, a first spacer 154 may be formed to cover the insulating liner 152 on both sidewalls of the bit line structure 140. The first spacer 154 may be formed of, for example, silicon oxide (as an example of oxide), silicon germanium (SiGe) compound, or polymer. However, the material of the first spacer 154 is not limited thereto. The first spacer 154 may be formed of a material that has an etch selectivity with respect to the insulating liner 152. For example, the first spacer 154 may be formed of an insulating material or a conductive material. The first spacer 154 may be formed of silicon oxide.

A second spacer 156 may be formed to have a desired (or alternatively, predetermined) thickness on the first spacer 154. The second spacer 156 may be formed of a different material than the first spacer 154. In an example embodiment, the second spacer 156 may be formed of, for example, a silicon oxide layer, a silicon nitride layer, or a silicon oxynitride layer. In an example embodiment, the first spacer 156 may be formed of silicon nitride. The second spacer 156 may be formed to have a thickness of about 20 Å to about 100 Å. The insulating liner 152, the first spacer 154, and the second spacer 156 may constitute the multilayer spacer 150 that surrounds both sidewalls of the bit line structure 140.

Subsequently, an insulating layer 170 may be formed on the buried insulating layer 126. The insulating layer 170 may be, for example, an oxide insulating layer. The insulating layer 170 may serve as a fence that surrounds both sides of a buried contact BC. Thereafter, a buried contact 180 may be formed at one side of the bit line structure 140 and at one side of the insulating layer 170. The buried contact 180 may be formed of, for example, doped polysilicon. In some cases, the buried contact 180 may be formed of metal, metal silicide, metal nitride, or any combinations thereof. The buried contact 180 may include a buried layer (not illustrated) and a conductive layer that is formed on the buried layer. In some embodiments, the buried layer may be formed in a Ti/TiN stack structure.

When the buried contact 180 is formed of a metal material, a metal silicide layer (not illustrated) may be formed between the buried contact 180 and the active region 116.

For example, the metal silicide layer may be a cobalt (Co) silicide layer. However, the metal silicide layer is not limited to the cobalt silicide layer. For example, the metal silicide layer may be formed of a material selected from various types of metal silicide.

Referring to FIGS. 12A to 12D, an upper portion of the buried contact 180 may be removed by an etch-back process to form a groove (not illustrated). A metal layer 190 may be formed to fill the groove formed by the etch-back process and cover a top surface of the multilayer spacer 150. The metal layer 190 may include a metal silicide layer (not illustrated) at a contact portion with respect to the buried contact 180. For example, the metal silicide layer may be a cobalt silicide layer. However, the metal silicide layer is not limited to a cobalt silicide layer.

The metal layer 190 may include a buried layer (not shown), an inner metal layer (not shown), and an upper metal layer (not shown). The buried layer may cover an inner wall of the groove, the bit line structure 140, and the top surface of the multilayer spacer 150. The inner metal layer may fill the groove on the buried layer. The upper metal layer may cover the bit line structure 140 and the top surface of the multilayer spacer 150 on the buried layer. In some example embodiments, the buried layer may be formed in, for example, a Ti/TiN stack structure. Also, in some example embodiments, at least one of the inner metal layer and the upper metal layer may include tungsten.

Figure 13A:
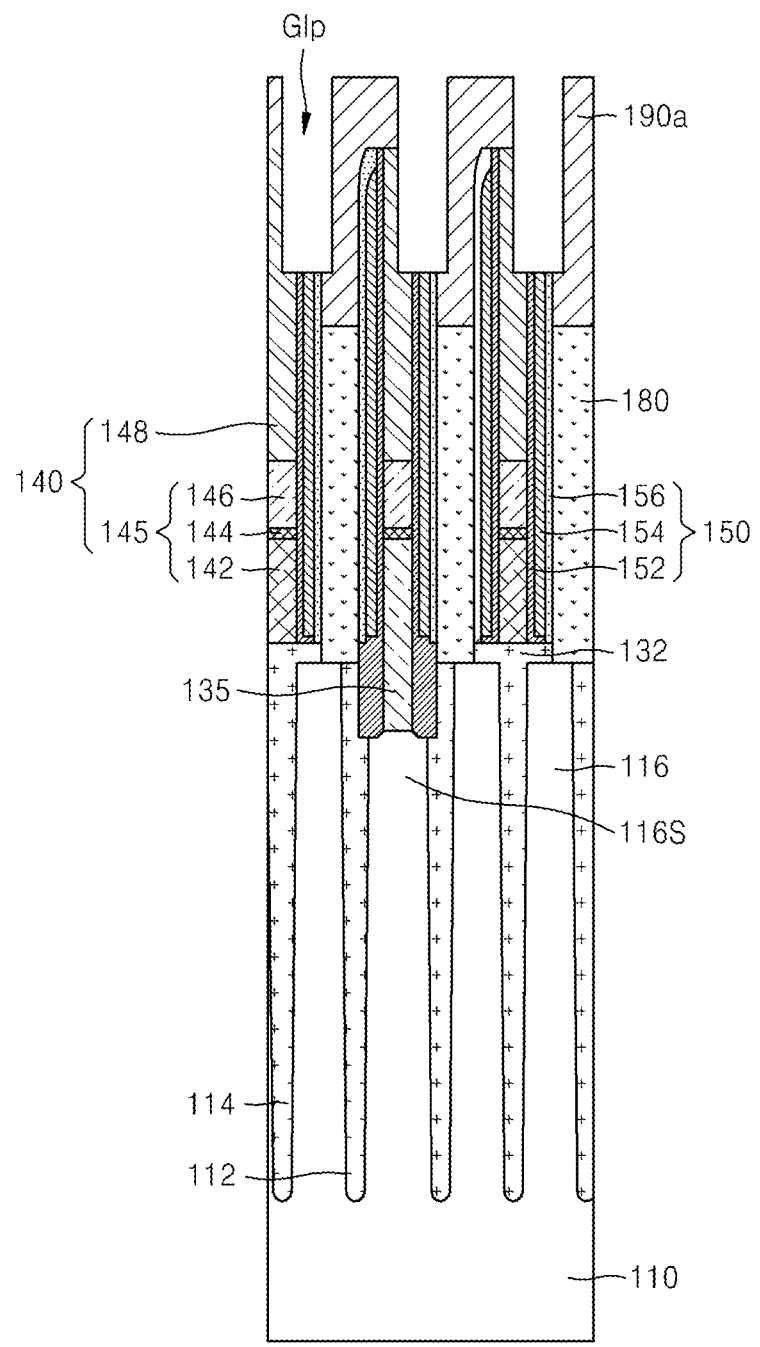
Figure 13B:
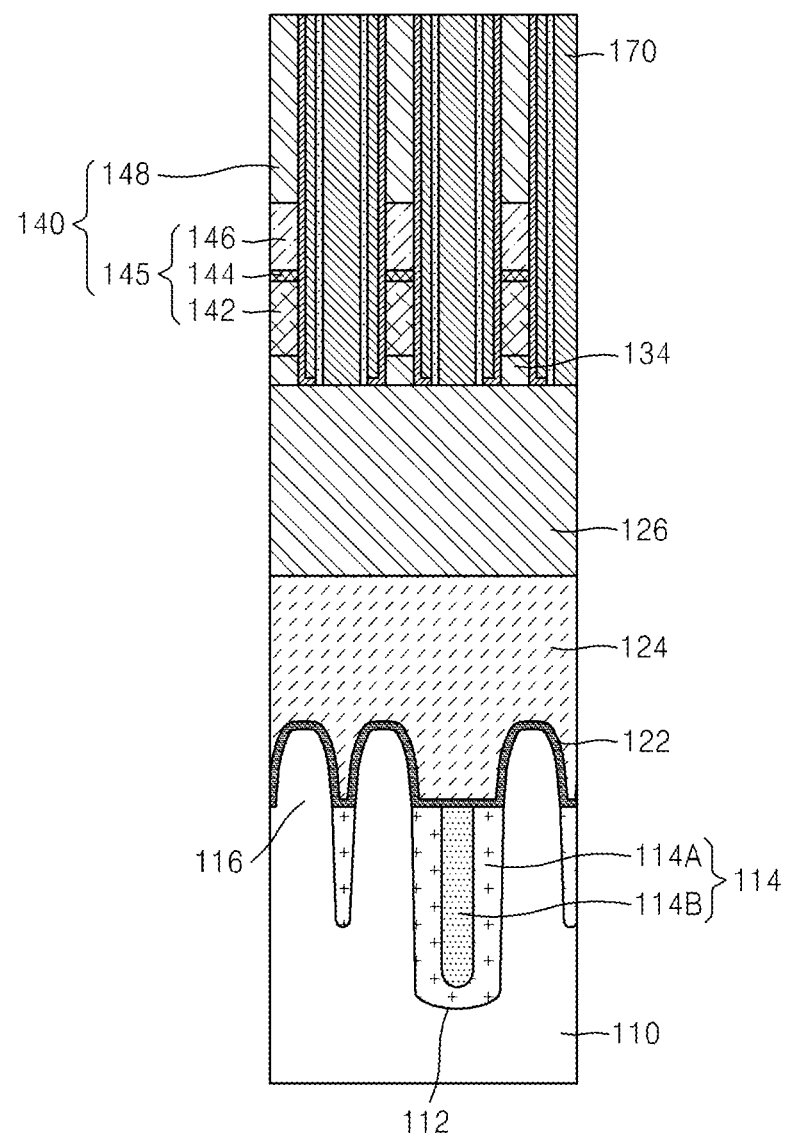
Figure 13C:
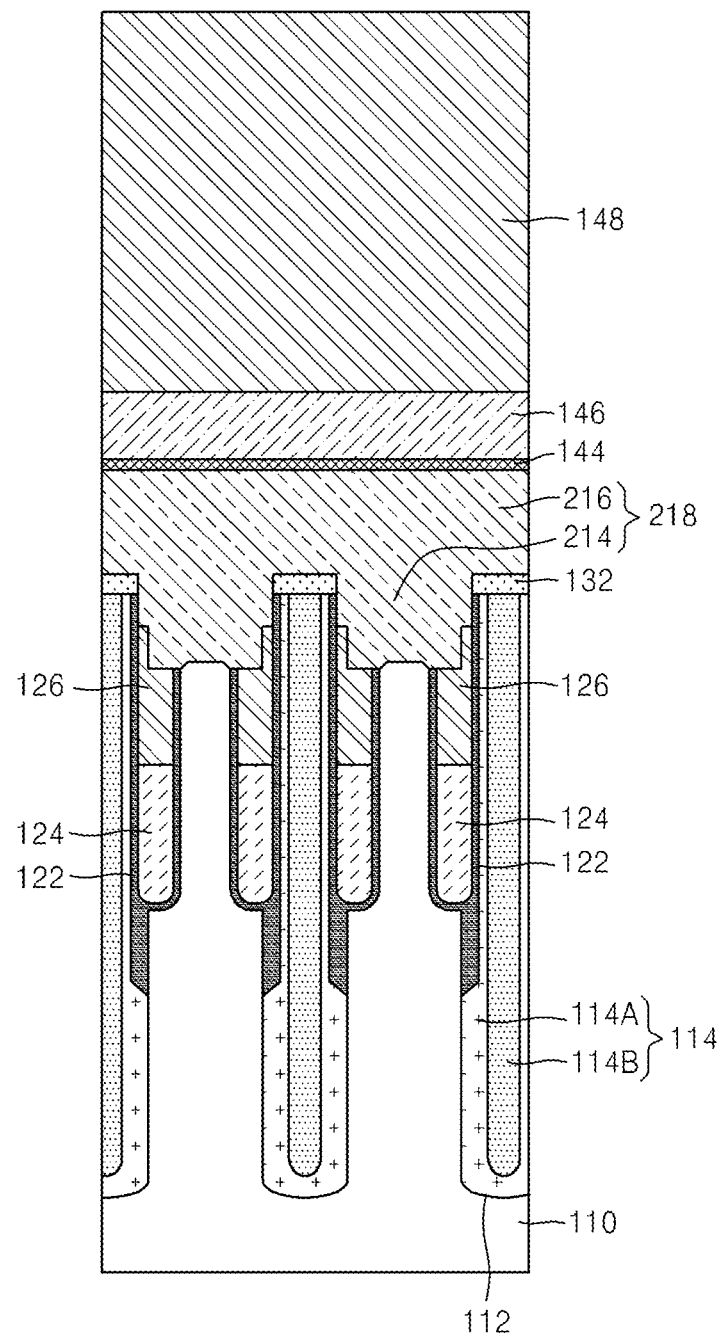
Figure 13D:
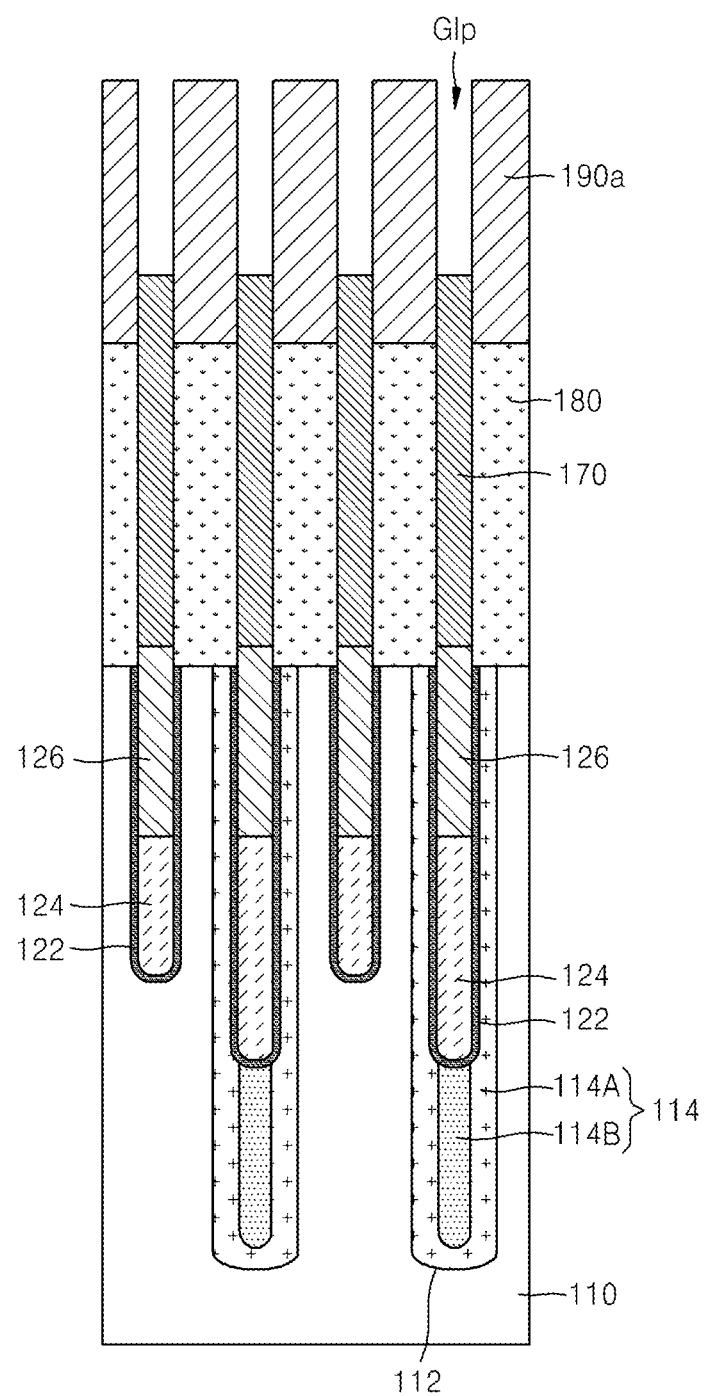

Referring to FIGS. 13A to 13C, a mask pattern (not illustrated) may be formed on the metal layer 190, and by using the mask pattern as an etch mask, the metal layer 190 and a portion of the bit line structure 140 thereunder may be etched to form a plurality of landing pads 190a that are connected to the buried contact 180.

Like the landing pad LP illustrated in FIG. 5, the mask pattern may have an island shape. Accordingly, while forming the landing pads 190a by using the mask pattern as an etch mask, a landing pad groove Glp may be formed as illustrated, and the landing pads 190a may be isolated from each. Also, a side surface of the bit line structure 140 may be exposed by the landing pad groove Glp.

As illustrated, in the process of forming the landing pad groove Glp, a right side surface of the capping pattern 148 may be removed, and an upper portion of the multilayer spacer 150 on a right sidewall of the capping pattern 148 may be removed. Accordingly, the landing pad 190a may have a structure that covers a left portion of the capping pattern 148 and the multilayer spacer 150 on a left sidewall of the capping pattern 148. Alternatively, the landing pads arranged on another line adjacent to the line I-I' of FIG. 5 may have a structure that covers a right portion of the capping pattern 148 and the multilayer spacer 150 on a right sidewall of the capping pattern 148.

Like the landing pad LP of FIG. 5, the landing pad 190a may be disposed along the second direction (Y-axis direction) in a zigzag configuration L1 (see FIG. 5) that alternately covers the multilayer spacer 150 on the left sidewall of the bit line structure 140 and the multilayer spacer 150 on the right sidewall of the bit line structure 140, and the landing pad 190 may have a structure that covers the multilayer spacer 150 formed on the same sidewall of each bit line structure 140. After the forming of the landing pads 190a, the mask pattern may be removed.

After the removing of the mask pattern, a capping insulating layer (not illustrated) may be formed to fill the landing pad groove Glp and cover a top surface of the landing pad 190a. The capping insulating layer may be formed of, for example, an oxide or nitride insulating material.

After forming the capping insulating layer, a plurality of capacitors (not illustrated) may be formed to be electrically connected to the landing pads 190a after passing through the capping insulating layer. The bit line 145 and the landing pad 190a may correspond respectively to the bit line BL and the landing pad LP illustrated in FIG. 5, and the buried contact 180 and the direct contact 135 may correspond respectively to the buried contact BC and the direct contact DC illustrated in FIG. 5.

Figure 14:
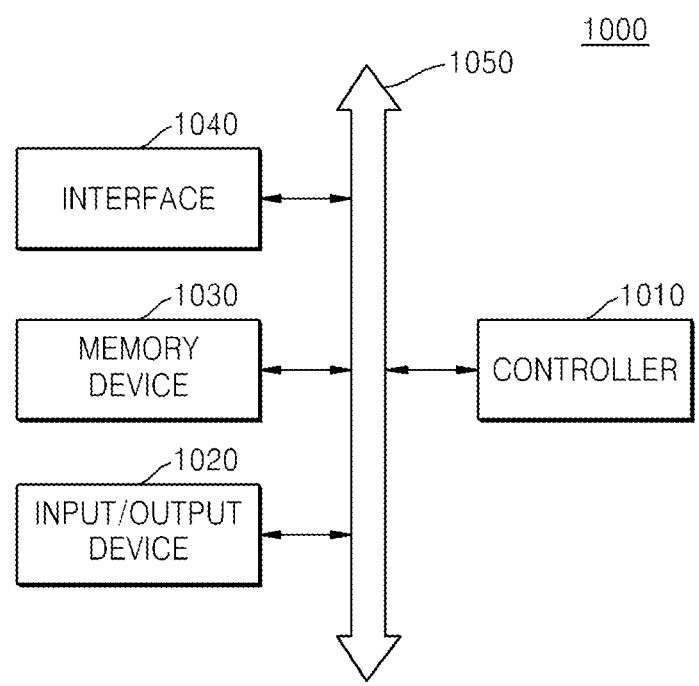
FIG. 14 illustrates a system including a semiconductor device manufactured according to an example embodiment.

FIG. 14 illustrates a system including a semiconductor device manufactured according to an example embodiment.

Referring to FIG. 14, a system 1000 according to the present example embodiment may include a controller 1010, an input/output device 1020, a memory device 1030, and an interface 1040. The system 1000 may be, for example, a mobile system or a system that transmits or receives information. In some example embodiments, the mobile system may be a PDA, a portable computer, a web tablet, a wireless phone, a mobile phone, a digital music player, or a memory card.

The controller 1010 may control an execution program in the system 1000. The controller 1210 may include, for example, a microprocessor, a digital signal processor, or a microcontroller. The input/output device 1020 may be used to input or output data of the system 1000. By using the input/output device 1020, the system 1000 may be connected to an external device, for example, a personal computer or a network to exchange data with the external device. The input/output device 1020 may be, for example, a keypad, a keyboard, or a display device.

The memory device 1030 may store codes and/or data for operation of the controller 1010, or store data processed by the controller 1010. The memory device 1030 may include a semiconductor device according to example embodiments. For example, the memory device 1030 may include at least one of the semiconductor devices that are manufactured by the above-described methods.

The interface 1040 may be a data transmission path between the system 1000 and other external devices. The controller 1010, the input/output device 1020, the memory device 1030, and the interface 1040 may communicate with each other through a bus 1050.

The system 1000 according to the present example embodiment may be used, for example, in mobile phones, MP3 players, navigation devices, portable multimedia players (PMPs), solid state disks (SSDs), or household appliances.

Figure 15:
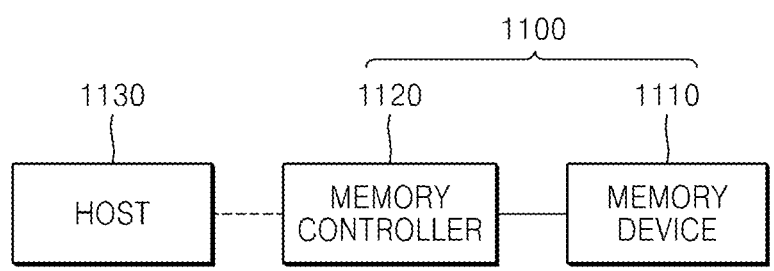
FIG. 15 illustrates a memory card including a semiconductor device manufactured according to an example embodiment.

FIG. 15 illustrates a memory card including a semiconductor device manufactured according to an example embodiment.

Referring to FIG. 15, a memory card 1100 according to the present example embodiment may include a memory device 1110 and a memory controller 1120. The memory device 1110 may store data. In some example embodiments, the memory device 1110 may have nonvolatile characteristics that may retain stored data even when power supply thereto is interrupted. The memory device 1110 may include at least one of the semiconductor devices that are manufactured by the above-described methods.

The memory controller 1120 may read data stored in the memory device 1110 or may store data in the memory device 1110, in response to a read/write request of a host 1130. The memory controller 1120 may include at least one of the semiconductor devices that are manufactured by the above-described methods.

While example embodiments have been particularly shown and described with reference to some example embodiments thereof, it will be understood that various changes in form and details may be made therein without departing from the spirit and scope of the following claims.

What is claimed is:

1. A method of manufacturing a semiconductor device, comprising:

forming a plurality of word lines on a substrate, the word line extending in a first direction and spaced apart from each other in a second direction perpendicular to the first direction;

forming an interlayer insulating layer on the word lines and the substrate;

forming direct contact holes between the word lines by etching the interlayer insulating layer and the substrate, the direct contact holes spaced apart from each other in the first direction and the second direction;

forming isolated contact filling portions filling the direct contact holes and an etch control portion physically connected to and covering top surfaces of the isolated contact filling portions by depositing a contact interconnection layer;

forming an interconnection layer on the isolated contact filling portions and the etch control portion; and forming a bit line and a direct contact pattern on the direct contact holes and the interlayer insulating layer by photo-etching the interconnection layer, the isolated contact filling portions, and the etch control portion, the bit line and the direct contact pattern being relatively narrow in the first direction and relatively wide in the second direction.

2. The method of claim 1, wherein each of the isolated contact filling portions is formed to have different first-directional distances between one side of at least one of the bit line and points at a boundary of a corresponding one of the direct contact holes in the second direction.

3. The method of claim 2, wherein one of the first-directional distance of the isolated contact filling portions along a virtual center line of the corresponding one of the direct contact holes is greater than other one of the first-directional distances of the isolated contact filling portions along a virtual non-center line in parallel with and spaced apart from the virtual center line.

4. The method of claim 1, wherein the direct contact holes are formed in parallel to the bit line in the second direction.

5. The method of claim 1, wherein the direct contact holes are formed to incline with respect to one side of the bit line in the first direction.

6. The method of claim 1, wherein a buried contact is formed at one side of the bit line and a corresponding one of the direct contact holes in the first direction.

7. The method of claim 1, wherein the etch control portion and the isolated contact filling portions each includes a conductive material, and the etch control portion serves to control an etch rate of the isolated contact filling portions such that a profile of a sidewall of each of the interconnection layers to be vertical in a cross-sectional view while forming the interconnection layers.

* * * * *